United States Patent
Hashizume et al.

(10) Patent No.: US 7,132,850 B2
(45) Date of Patent: Nov. 7, 2006

(54) SEMICONDUCTOR INTEGRATED CIRCUIT AND CIRCUIT DESIGN APPARATUS

(75) Inventors: Takeshi Hashizume, Tokyo (JP); Takenobu Iwao, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 134 days.

(21) Appl. No.: 10/689,708

(22) Filed: Oct. 22, 2003

(65) Prior Publication Data

US 2004/0207429 A1 Oct. 21, 2004

(30) Foreign Application Priority Data

Apr. 21, 2003 (JP) ............... 2003-115922

(51) Int. Cl.
*H03K 19/177* (2006.01)
(52) U.S. Cl. ............... 326/40; 326/47; 716/17
(58) Field of Classification Search ............ 326/40
See application file for complete search history.

(56) References Cited

U.S. PATENT DOCUMENTS

| | | | |
|---|---|---|---|
| 6,279,045 B1 * | 8/2001 | Muthujumaraswathy et al. | 710/5 |
| 6,462,577 B1 * | 10/2002 | Lee et al. | 326/40 |
| 6,894,530 B1 * | 5/2005 | Davidson et al. | 326/38 |
| 6,966,044 B1 * | 11/2005 | Reuland et al. | 716/17 |
| 2004/0111690 A1 * | 6/2004 | Reuland et al. | 716/17 |
| 2005/0078544 A1 * | 4/2005 | Vogel | 365/230.05 |

FOREIGN PATENT DOCUMENTS

| | | |
|---|---|---|
| JP | 2001-345384 | 12/2001 |
| JP | 2001-345694 | 12/2001 |

* cited by examiner

*Primary Examiner*—James Cho
(74) *Attorney, Agent, or Firm*—Buchanan Ingersoll & Rooney PC

(57) ABSTRACT

A semiconductor integrated circuit includes a memory for holding data of a logic circuit inputs or outputs. The memory is composed of logic cells, and is placed in a logic region. Thus, the semiconductor integrated circuit can prevent forming wasted space, in which no circuit component is built, and reduce its area and power consumption. It can reduce the design period of the memory as compared with the case where hard macro cells are used.

8 Claims, 27 Drawing Sheets

FIG.31

```
modulo dpram (CSC1,CSC2,T1,T2,WEC1,WEC2,A1,A2,UI1,UI2,DO1,DO2);
input            CSC1,CSC2;
input            T1,T2;
input            WEC1,WEC2;
input    [3:0]   A1,A2;
input    [7:0]   DI1,DI2;
output   [7:0]   DO1,DO2;

reg      [15:0]  WDL1,WDL2;
wire     [7:0]   DOC1,DOC2;
reg      [7:0]   DO1,DO2;

//PORT1
//Address Decoder
  always@(A1 or CSC1 or T1)begin
        if((T1==1'b1) & (CSC1==1'b0))begin
            casez (A1)       //synopsys parallel_case
                4'h0: WDL1=16'b0000000000000001;
                4'h1: WDL1=16'b0000000000000010;
                4'h2: WDL1=16'b0000000000000100;
                4'h3: WDL1=16'b0000000000001000;
                4'h4: WDL1=16'b0000000000010000;
                4'h5: WDL1=16'b0000000000100000;
... (OMITTED) ...

//Output Latch
//PORT1
  HOLDX1 DO10HOLD (,Y(DOC1[0]));
  HOLDX1 DO11HOLD (,Y(DOC1[1]));
... (OMITTED) ...
  HOLDX1 DO16HOLD (,Y(DOC1[6]));
  HOLDX1 DO17HOLD (,Y(DOC1[7]));

always@(negedge T1)begin
        if(^CSC1 & WEC1) DO1=^DOC1;
  end

//PORT2
  HOLDX1 DO20HOLD (,Y(DOC2[0]));
  HOLDX1 DO21HOLD (,Y(DOC2[1]));
  HOLDX1 DO22HOLD (,Y(DOC2[2]));
... (OMITTED) ...
  HOLDX1 DO27HOLD (,Y(DOC2[7]));

always@(negedge T2)begin
        if(^CSC2 & WEC2) DO2=^DOC2
  end endmodule
```

FIG.32

```
module dpram (CSC1,CSC2,T1,T2,WEC1,WEC2,A1,A2,DI1,DI2,DO1,DO2);
input    [7:0] A1;
output   [7:0] DO2;
input    [7:0] A2;
input    [7:0] DI1;
input    [7:0] DI2;
output   [7:0] DO1;
input    CSC1,CSC2,T1,T2,WEC1,WEC2;
    wire DO25_3_,DO26_0_,DO1E_3_,DO1F_0_,DO19_7_,IDO1_7_,IDO2_4_,
        DO14_2_,DO17_1_,A1L_4_,DO20_2_,DO28_6_,DO12_5_,DO11_6_,DO2A_6_,
        DO2B_5_,DO20_7_,DI2L_7_,DO23_4_,DO1C_4_,WEC1L,WD1_10,DO28_2_,
        DO2D_6_,DO17_5_,DO14_6_,DO19_3_,ID01_3_,IDO2_0_,DO1F_4_,DO1E_7_,
        DO25_7_,DO26_4_,WD1_14,DO20_3_,DO23_0_,DO10_0_,DI2L_3_,DO2B_1_,
        DO11_2_,DO2A_2_,CSC2L,A1LL_3_,DO12_1_,DO2A_0_,A1LL_1_,DO12_3_,
        DO2B_3_,DO11_0_,DO1C_2_,DO20_1_,DO23_2_,DI2L_1_,DO19_1_,DO1E_5_,
... OMITTED ...
DLATN DI2L_reg_6_(,D(DI2[6]),,GN(n5573),,Q(DI2L_6_));
NOR2 U367 (,A(n5573),,B(n5646),,Y(n_564));
NOR2 U368 (,A(n5569),,B(n5647),,Y(n_461));
AND2 S_27 (,A(n_371),,B(WEC1L),,Y(n_372));
INV S_21 (,A(CSC1L),,Y(n_366));
AND2 S_33 (,A(n_385),,B(WEC2L),,Y(n_396));
INV S_23 (,A(CSC2L),,Y(n_368));
DLATN A1L_reg_7_(,D(A1[7]),,GN(T1),,Q(A1L_7_));
DLATN A1L_reg_6_(,D(A1[6]),,GN(n5569),,Q(A1L_6_));
... OMITTED ...
DLAT DO2_reg_5_(,D(IDO2_5_),,G(n_564),,Q(DO2[5]));
DLAT DO2_reg_4_(,D(IDO2_4_),,G(n_564),,Q(DO2[4]));
DLAT DO2_reg_3_(,D(IDO2_3_),,G(n_564),,Q(DO2[3]));
DLAT DO2_reg_2_(,D(IDO2_2_),,G(n_564),,Q(DO2[2]));
DLAT DO2_reg_1_(,D(IDO2_1_),,G(n_564),,Q(DO2[1]));
DLAT DO2_reg_0_(,D(IDO2_0_),,G(n_564),,Q(DO2[0]));
DLATN CSC1L_reg (,D(CSC1),,GN(T1),,Q(CSC1L),,QN(n_371));
DLAT RE2_reg (,D(n_386),,G(T2),,QN(n5646));
DLATN CSC2L_reg (,D(CSC2),,GN(T2),,Q(CSC2L),,QN(n_385));
DLAT RE1_reg (,D(n_372),,G(T1),,QN(n5647));
endmodule
```

FIG.33

```
module LOGIC(D,SYSCLK,TCLK,CE, ... (OMITTED) ...);
... (OMITTED) ...
INV U999 (,Y(n_22261),,A(n_8876));
NAND2 U1000 (,Y(n_22262),,A(n_12222),,B(n_877));
NORD2 U1001 (,Y(n_22263),,A(n_12111),,B(n_4435));
INV U1002 (,Y(n_22264),,A(n_22262));
INV U1003 (,Y(n_22265),,A(n_22263));
dpram dpram_0 (,CSC1(n_22264),,CSC2(net_22001),,T1(n_33),,T2(n_887)
,,WEC1(n_22265),,WEC2(n_6654), ... (OMITTED) ...);
INV U1004 (,Y(n_22266),,A(n_6676));
... (OMITTED) ...
endmodule
``` module LOGIC(D,SYSCLK,TCLK,CE, ... (OMITTED) ...);
... (OMITTED) ...
INV U999 (,Y(n_22261),, A(n_8876)):
NAND2 U1000 (,Y(n_22262),, A(n_12222),,B(n_877));
NORD2 U1001 (,Y(n_22263),, A(n_12111),,B(n_4435));
dpram dpram_0 (,CSC1(n_22262),,CSC2(net_22001),,T1(n_33),,T2(n_887)
,,WEC1_(n_22263),,WEC2(n_6654), ... (OMITTED) ...);
INV U1002 (,Y(n_22264),,A(n_6676));
... (OMITTED) ...
endmodule
module dpram (CSC1_,CSC2,T1,T2,WEC1_,WEC2,A1,A2,DI1,DI2,DO1,DO2);
input    [7:0] A1;
... (OMITTED) ...
    DLATN CSC2L_reg (,D(CSC2),,GN(T2),.Q(CSC2L),,QN(n_385));
    DLAT RE1_reg (,D(n_372),,G(T1),.QN(n5647));
endmodule

SEMICONDUCTOR INTEGRATED CIRCUIT AND CIRCUIT DESIGN APPARATUS

BACKGROUND OF THE INVENTION

1. Field of the Invention

The present invention relates to a semiconductor integrated circuit including a memory, and a circuit design apparatus for designing the circuit of the semiconductor integrated circuit.

2. Description of Related Art

A conventional semiconductor integrated circuit usually places its logic circuit composed of logic cells in a logic region.

In contrast, it places a memory for storing data input to or output from the logic circuit in a hard macro cell region, because the memory is a hard macro with its layout structure as well as its circuit configuration being specified.

Accordingly, the memory is not always placed near the logic circuit, and hence long wiring can be required between the logic circuit and memory in some cases. Thus, it is necessary for the memory to have driving power to cope with the long wiring.

In addition, as for a small capacity memory embedded in a semiconductor integrated circuit, the region for the address decoder and IO buffers corresponding to the memory becomes relatively large when the memory is configured by the hard macro. This is because the hard macro specifies not only the circuit configuration, but also its layout in advance. Furthermore, a ratio of the region including no circuit components becomes relatively large. Accordingly, the area per memory capacity increases with the reduction in the capacity.

If the geometry of the memory with a desired capacity does not match the geometry of the region where the memory is to be placed, a method is applicable of dividing the memory in order to place the subdivisions to the region as disclosed in the following Relevant Reference 1. However, the method configures the memory not with the logic cells, but with the hard macro.

Relevant Reference 1: Japanese patent application laid-open No. 2001-345384 (pages 6 and 7, and FIG. 2).

With the foregoing configuration, the conventional semiconductor integrated circuit has a problem of increasing its area and power consumption because of the long wiring between the logic circuit and the memory. In addition, it has a problem of increasing the ratio of the region where no circuit component is formed, when a small capacity memory is embedded in the circuit.

Furthermore, it has a problem of requiring a lot of time and manpower when the memory is configured with the hard macro because of a difficult circuit design.

SUMMARY OF THE INVENTION

The present invention is implemented to solve the foregoing problems. It is therefore an object of the present invention to provide a semiconductor integrated circuit capable of eliminating an unnecessary region in which no circuit is formed, thereby being able to reduce the area and power consumption of the circuit.

Another object of the present invention is to provide a semiconductor integrated circuit and a circuit design apparatus capable of reducing the design period.

According to a first aspect of the present invention, there is provided a semiconductor integrated circuit including a memory that holds data a logic circuit inputs or outputs, and that is composed of logic cells, and is placed in a logic region. Thus, it can prevent forming wasted space, in which no circuit is built, and hence reduce its area and power consumption. In addition, it can reduce the design period of the memory as compared with the case where hard macro cells are used.

According to a second aspect of the present invention, there is provided a circuit design apparatus including: a memory netlist generating section for generating a netlist of a memory from parameters defined by a parameter definition section; and an optimization section for generating a netlist of the semiconductor integrated circuit by carrying out logic optimization processing between a netlist of a logic section other than the memory and the netlist of the memory. It can optimize the logic in its entirety with ease, and offers an advantage of being able to reduce the design period of the semiconductor integrated circuit.

According to a third aspect of the present invention, there is provided a circuit design apparatus including: a bank array design section for designing a register bank array by arraying register banks; and a bank adjustment section for adjusting the number of register banks by deleting an unnecessary register bank from the register bank array, or by adding a necessary register bank to the register bank array. It configures the array in a stepwise process, and hence can facilitate the logic optimization processing. Thus, it offers an advantage of being able to reduce the design period of the semiconductor integrated circuit.

BRIEF DESCRIPTION OF THE DRAWINGS

FIG. 31 is a list showing an example of synthesis data;

FIG. 32 is a list showing an example of a netlist of a memory;

FIG. 33 is a list showing an example of a netlist of a logic section other than the memory;

DETAILED DESCRIPTION OF THE PREFERRED EMBODIMENTS

The invention will now be described with reference to the accompanying drawings.

Embodiment 1

Figure 1:
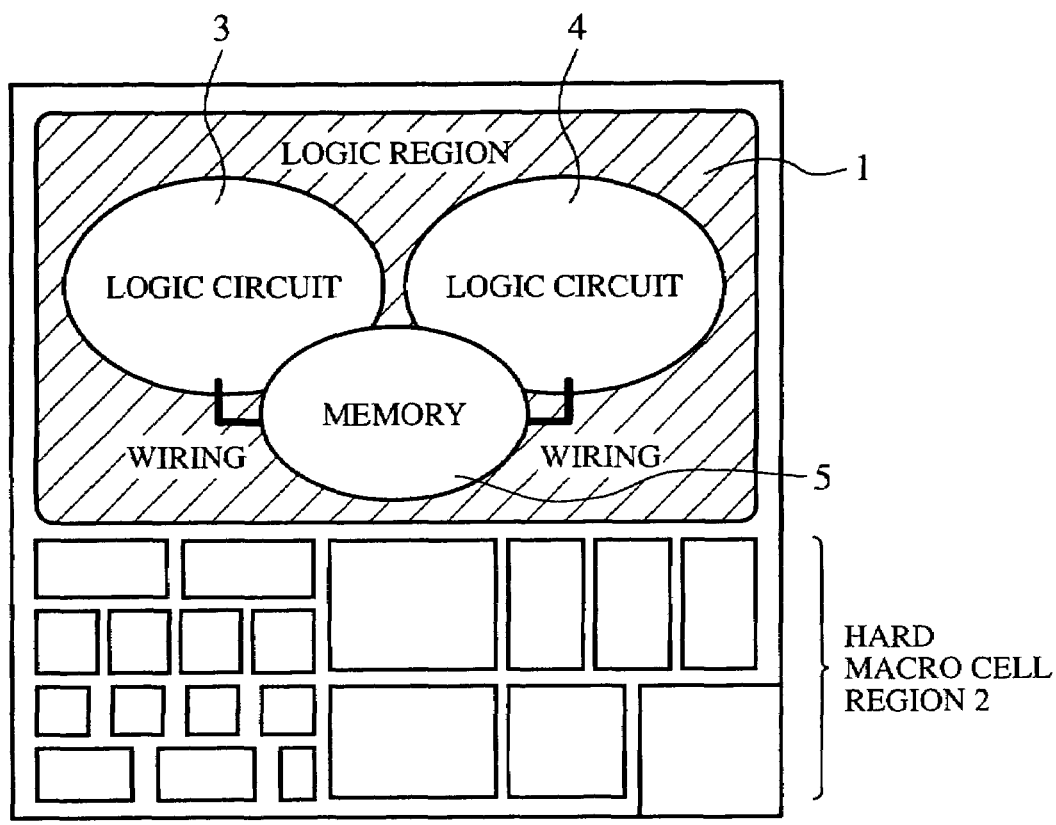
FIG. 1 is a schematic diagram showing a layout of an embodiment 1 of the semiconductor integrated circuit in accordance with the present invention.

FIG. 1 is a diagram showing a layout of an embodiment 1 of a semiconductor integrated circuit in accordance with the present invention. In FIG. 1, logic circuits 3 and 4, which are composed of logic cells, are placed in a logic region 1 of the semiconductor integrated circuit. A memory 5 for storing data input to and output from the logic circuits 3 and 4 is composed of logic cells and placed in the logic region 1 of the semiconductor integrated circuit. The logic circuits 3 and 4 and the memory 5 may be independent of each other, or part of them may overlap each other.

A hard macro cell region 2 of the semiconductor integrated circuit includes various types of hard macro cells.

Figure 2:
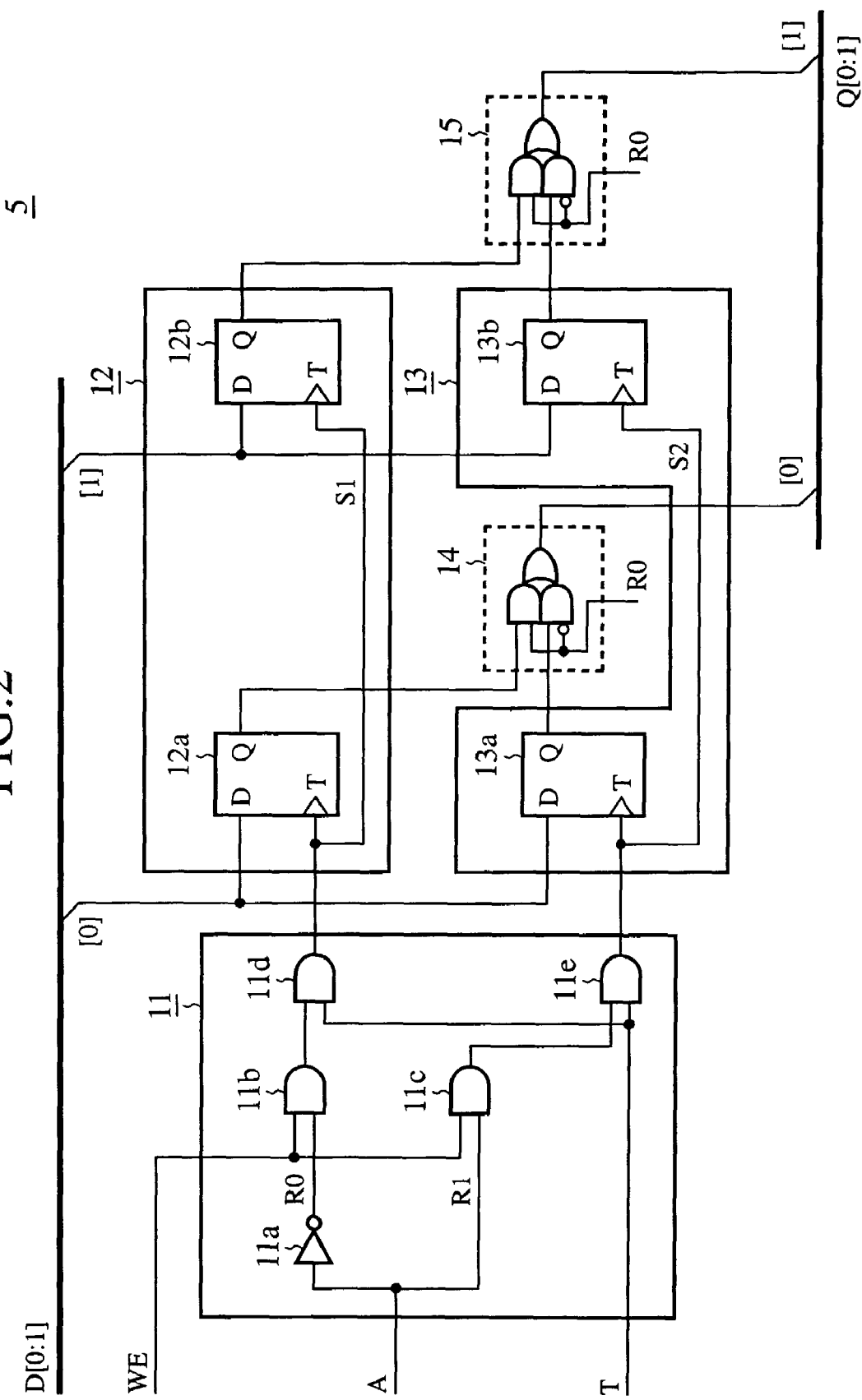
FIG. 2 is a circuit diagram showing a configuration of the memory of the embodiment 1 of the semiconductor integrated circuit in accordance with the present invention.

FIG. 2 is a circuit diagram showing a configuration of the memory of the embodiment 1 of the semiconductor integrated circuit in accordance with the present invention. In FIG. 2, a control signal generator 11, which includes an inverter 11a and AND gates 11b–11e, constitutes a control signal generating section for generating control signals S1 and S2 from a read write signal WE, address signal A and clock T.

A data holder 12 is composed of 1-bit flip-flops 12a and 12b. It holds data D[0:1] output from the logic circuit 3 when the control signal S1 generated by the control signal generator 11 instructs data write (S1=clock T). On the other hand, when the control signal S1 disables the data write (S1="L"), the data holder 12 rejects writing the data D[0:1] output from the logic circuit 3, and accepts only reading the stored data.

A data holder 13 is composed of 1-bit flip-flops 13a and 13b. It holds data D[0:1] output from the logic circuit 3 when the control signal S2 generated by the control signal generator 11 instructs data write (S2=clock T). On the other hand, when the control signal S2 disables the data write (S2="L"), the data holder 13 rejects writing the data D[0:1] output from the logic circuit 3, and accepts only reading the stored data. Incidentally, the data holders 12 and 13 constitute a data holding section.

A multiplexer 14 selects the data Q[0] output from the flip-flop 12a when the address signal A is at logic-L, and the data Q[0] output from the flip-flop 13a when the address signal A is at logic-H. On the other hand, a multiplexer 15 selects the data Q[1] output from the flip-flop 12b when the address signal A is at logic-L, and the data Q[1] output from the flip-flop 13b when the address signal A is at logic-H. The multiplexers 14 and 15 constitute a selecting section.

Next, the operation of the present embodiment 1 will be described.

The example of FIG. 2 constitute a 2 word×2 bit single-port memory 5. The memory 5, which is composed of standard logic cells such as inverters, AND gates, flip-flops and multiplexers, can be placed near the logic circuits 3 and 4 in the logic region 1. Accordingly, the wiring between the logic circuits 3 and 4 and the memory 5 is short.

Next, the operation of the memory 5 of FIG. 2 will be described briefly.

First, in a write mode that writes the data D[0:1] output from the logic circuit 3 to the memory 5, the control signal generator 11 receives the logic-H read write signal WE.

Then, when the logic-L address signal A is input to the control signal generator 11, its inverter 11a supplies a logic-H address signal R0 to the input terminal of the AND gate 11b. In contrast, the input terminal of the AND gate 11c is supplied with a logic-L address signal R1.

Accordingly, the output signal of the AND gate 11c of the control signal generator 11 becomes logic-L. Thus, the control signal S2 the AND gate 11e supplies to the flip-flops 13a and 13b also becomes logic-L, thereby preventing the data D[0:1] from being written into the flip-flops 13a and 13b.

In contrast, the output signal of the AND gate 11b of the control signal generator 11 becomes logic-H so that the AND gate 11d supplies the logic-H control signal S1 to the flip-flops 12a and 12b when the clock T becomes logic-H. In other words, the AND gate 11d supplies the clock T to the flip-flops 12a and 12b.

Receiving the logic-H control signal S1 from the AND gate lid of the control signal generator 11, the flip-flop 12a of the data holder 12 reads the data D[0] output from the logic circuit 3 and stores it. Likewise, receiving the logic-H control signal S1 from the AND gate 11d of the control signal generator 11, the flip-flop 12b reads the data D[1] output from the logic circuit 3 and stores it.

Subsequently, when the logic-H address signal A is input to the control signal generator 11, its inverter 11a supplies the logic-L address signal R0 to the input terminal of the AND gate 11b. In contrast, the input terminal of the AND gate 11c is supplied with the logic-H address signal R1.

Thus, the output signal of the AND gate 11b of the control signal generator 11 becomes logic-L, and hence the control signal S1 the AND gate 11d supplies to the flip-flops 12a and 12b also becomes logic-L. Consequently, the data D[0:1] are not written into the flip-flops 12a and 12b.

However, since the output signal of the AND gate 11c of the control signal generator 11 becomes logic-H, the AND gate 11e supplies the logic-H control signal S2 to the flip-flops 13a and 13b when the clock T becomes logic-H. In other words, the AND gate 11e supplies the clock T to the flip-flops 13a and 13b.

Receiving the logic-H control signal S2 from the AND gate 11e of the control signal generator 11, the flip-flop 13a of the data holder 13 reads the data D[0] output from the logic circuit 3 and stores it. Likewise, receiving the logic-H control signal S2 from the AND gate 11e of the control signal generator 11, the flip-flop 13b reads the data D[1] output from the logic circuit 3 and stores it.

On the other hand, in a read mode (mode of preventing the data write to the data holders 12 and 13) of reading the data D[0:1] stored in the memory 5, the logic-L read write signal WE is supplied to the control signal generator 11. In response to it, the control signal generator 11 outputs the logic-L control signals S1 and S2 regardless of the logic of the address signal A and clock T.

Accordingly, the data D[0:1] are not written into the flip-flops 12a and 12b of the data holder 12, or into the flip-flops 13a and 13b of the data holder 13.

When the logic-L address signal A is input to the control signal generator 11, its inverter 11a supplies the logic-H address signal R0 to the multiplexers 14 and 15. In response to it, the multiplexer 14 selects the data held by the flip-flop 12a, that is, the data Q[0], and supplies it to the logic circuit 4.

Likewise, the multiplexer 15 selects the data held by the flip-flop 13a, that is, the data Q[1], and supplies it to the logic circuit 4.

Subsequently, when the logic-H address signal A is input to the control signal generator 11, its inverter 11a supplies the logic-L address signal R0 to the multiplexers 14 and 15 via the inverter 11a. In response to it, the multiplexer 14 selects the data held by the flip-flop 13b, that is, the data Q[0], and supplies it to the logic circuit 4.

Likewise, the multiplexer 15 selects the data held by the flip-flop 13b, that is, the data Q[1], and supplies it to the logic circuit 4.

As described above, the present embodiment 1 is configured such that the memory 5 for storing the data the logic circuits 3 and 4 input and output is composed of the logic cells, and is placed in the logic region 1. Thus, the present embodiment 1 offers an advantage of being able to eliminate the unnecessary region including no circuit component, thereby being able to reduce the area and power consumption. In addition, it offers an advantage of being able to reduce the design period of the memory 5 as compared with the case using the hard macro cells.

In addition, according to the present embodiment 1, the memory 5 is composed of the control signal generator 11 for generating the control signals S1 and S2 from the read write signal WE; the data holders 12 and 13 for holding the data output from the logic circuit 3 when the control signals S1 and S2 generated by the control signal generator 11 instructs the data write, and for accepting only reading the stored data when the control signals S1 and S2 disable the data write; and the multiplexers 14 and 15 for selecting the data corresponding to the address signal A from the data held in the data holders 12 and 13, and supplies the selected data to the logic circuit 4. In other words, it configures the memory 5 from the standard logic cells such as the inverter, AND gates, flip-flops, multiplexers. As a result, it offers an advantage of being able to easily construct the memory 5 placeable in the same logic region 1 as the logic circuits 3 and 4.

Embodiment 2

Figure 3:
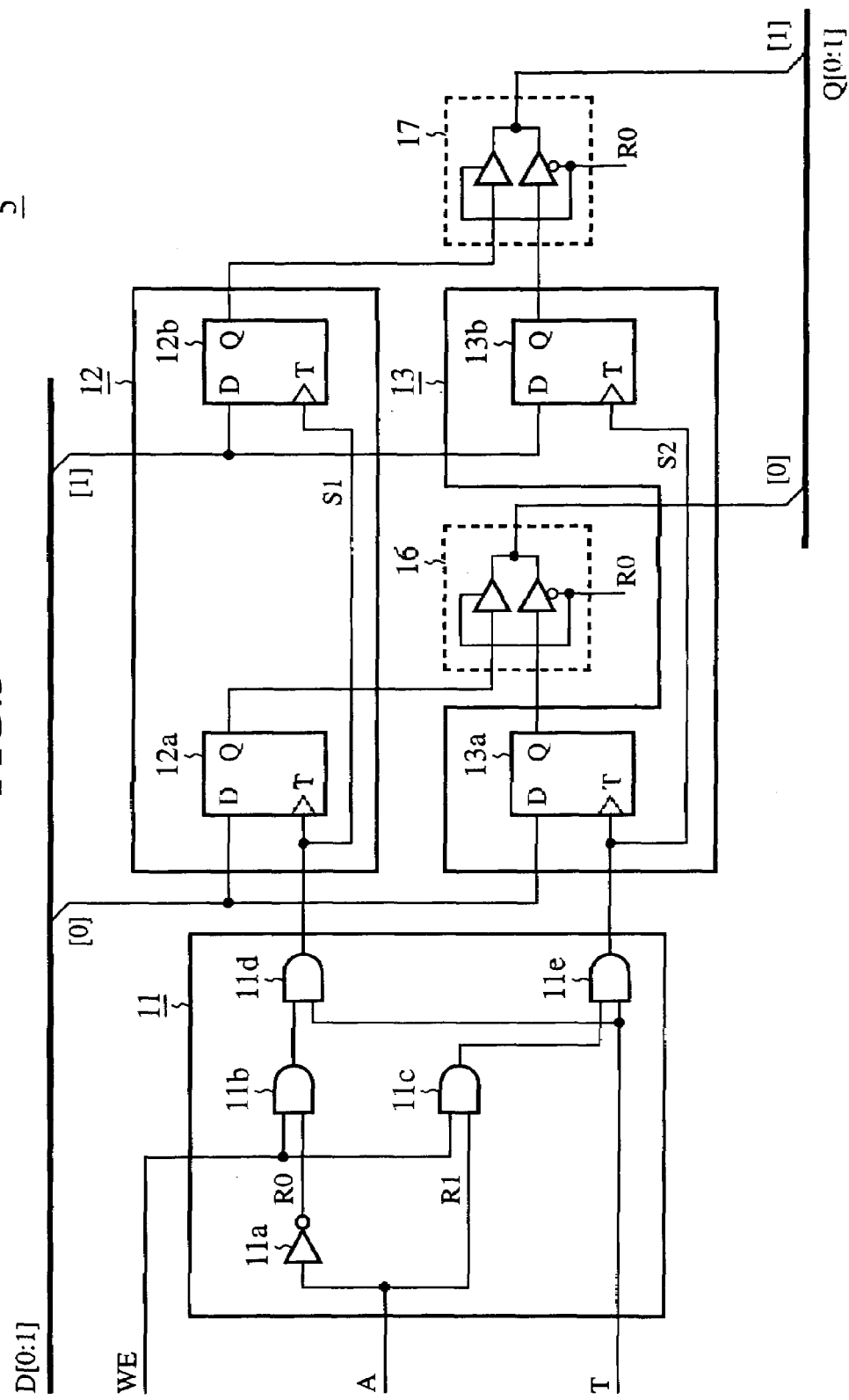
FIG. 3 is a circuit diagram showing a configuration of the memory of an embodiment 2 of the semiconductor integrated circuit in accordance with the present invention.

Although the foregoing embodiment 1 has the multiplexers 14 and 15 select the data corresponding to the address signal A, and supply the selected data to the logic circuit 4, this is not essential. For example, as shown in FIG. 3, the selecting section can be configured using tristate buffers 16 and 17 instead of the multiplexers 14 and 15.

Using the tristate buffers 16 and 17 can make the circuit scale smaller than using the multiplexers 14 and 15. Thus, the present embodiment 2 offers an advantage of being able to reduce the circuit scale, particularly when the total number of bits of the data is large.

Embodiment 3

Figure 4:
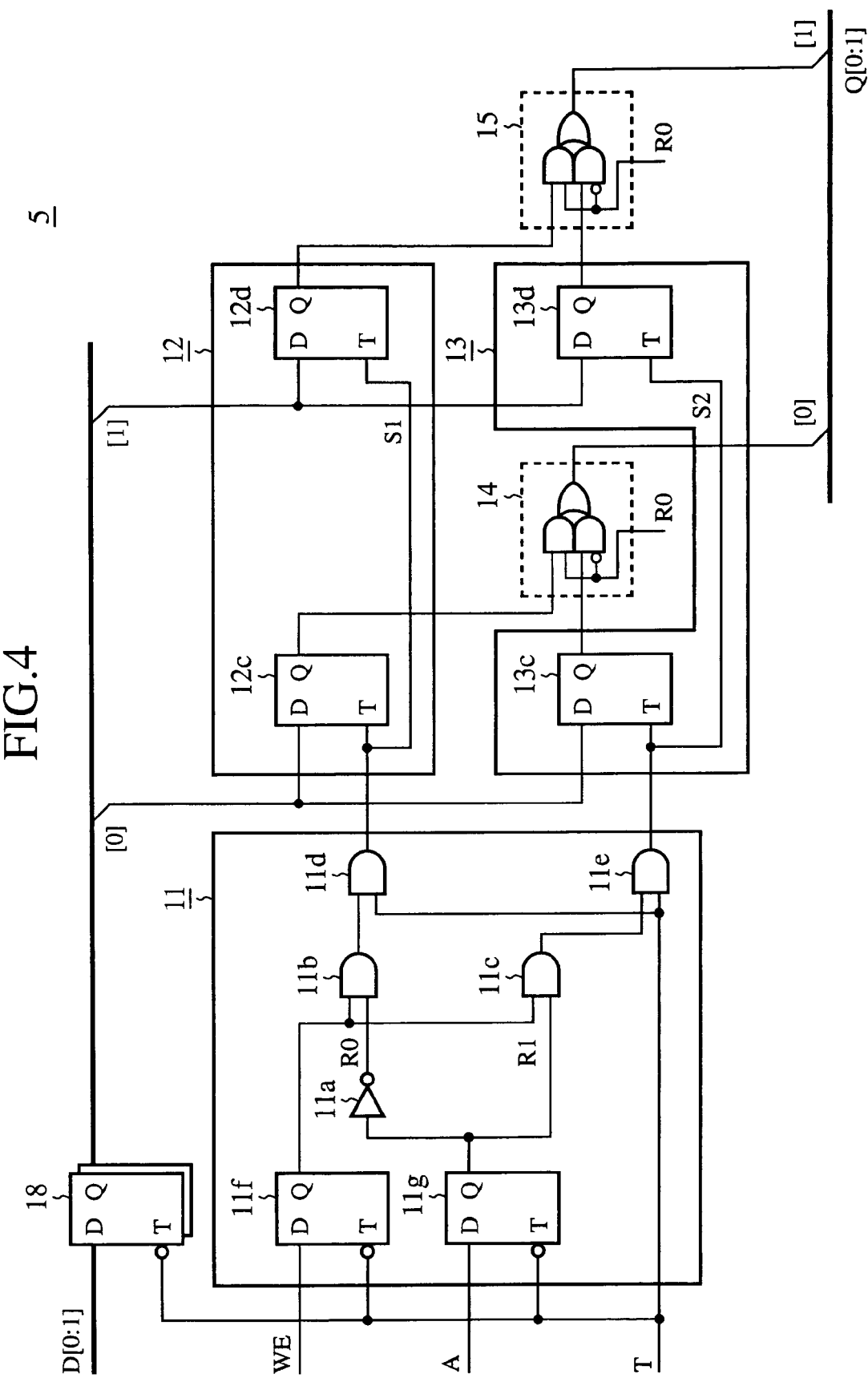
FIG. 4 is a circuit diagram showing a configuration of the memory of an embodiment 3 of the semiconductor integrated circuit in accordance with the present invention.

Although the foregoing embodiment 1 configures the data holders 12 and 13 using the flip-flops 12a, 12b, 13a and 13b, this is not essential. For example, as shown in FIG. 4, the data holders 12 and 13 can be constructed using D-latches 12c, 12d, 13c and 13d.

In this case, however, it is necessary to install 1-bit D-latches 11f and 11g and a 2-bit D-latch 18, which operate in response to the inversion of the clock T, which is supplied to the D-latches 12c, 12d, 13c and 13d.

Thus using the D-latches 12c, 12d, 13c and 13d to configure the data holders 12 and 13 can nearly halve the circuit scale of the data holders 12 and 13 as compared with the case using the flip-flops 12a, 12b, 13a and 13b. Thus, the present embodiment 3 offers an advantage of being able to reduce the circuit scale, particularly when the total number of bits of the memory 5 is greater than the number of the input signals.

Embodiment 4

Figure 5:
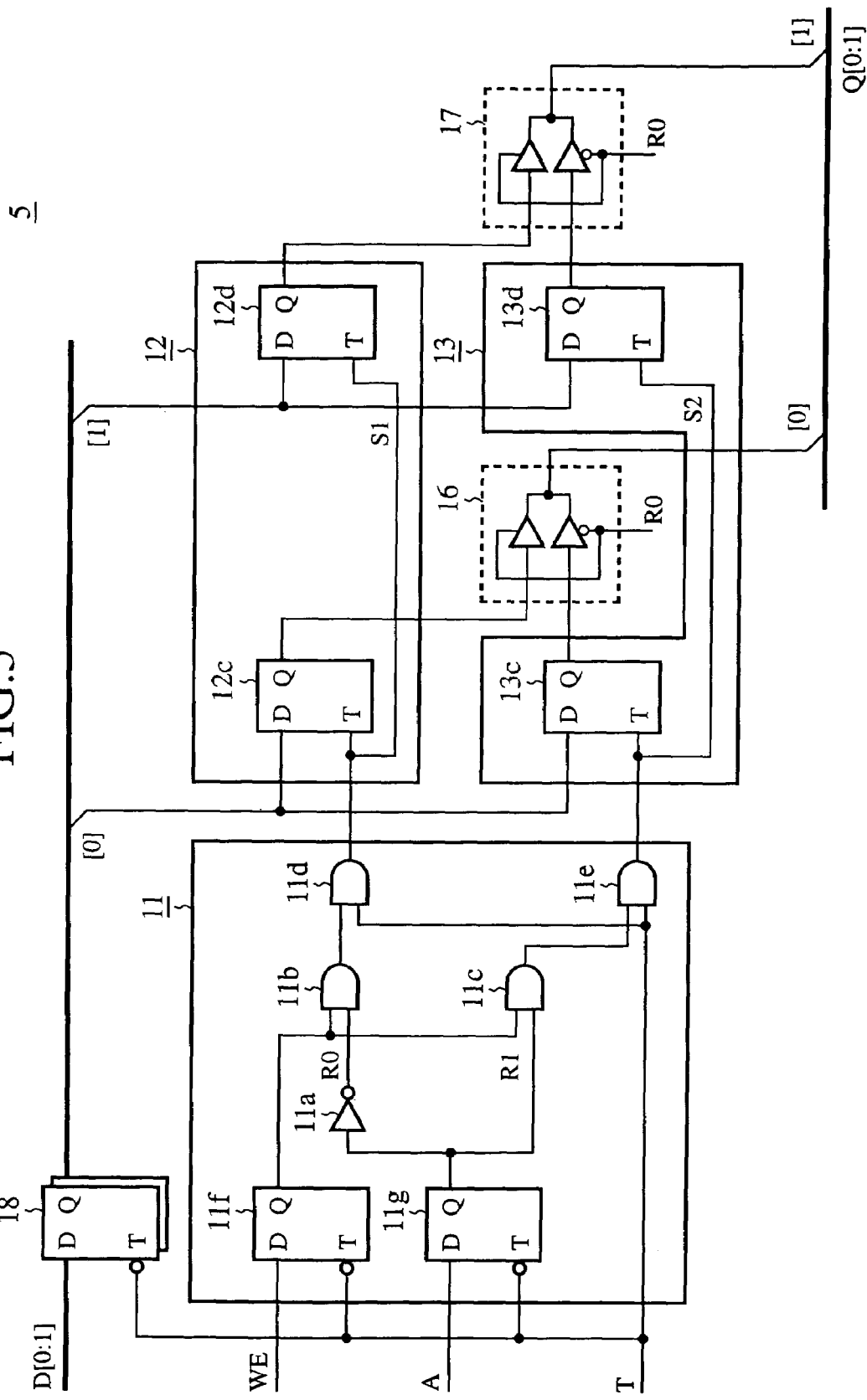
FIG. 5 is a circuit diagram showing a configuration of the memory of an embodiment 4 of the semiconductor integrated circuit in accordance with the present invention.

Although the foregoing embodiment 3 has the multiplexers 14 and 15 select the data corresponding to the address signal A, and supply the selected data to the logic circuit 4, this is not essential. For example, as shown in FIG. 5, the selecting section can be configured using tristate buffers 16 and 17 instead of the multiplexers 14 and 15.

Using the tristate buffers 16 and 17 can make the circuit scale smaller than using the multiplexers 14 and 15. Thus, the present embodiment 4 offers an advantage of being able to reduce the circuit scale, particularly when the total number of bits of the data is large.

Embodiment 5

Figure 6:
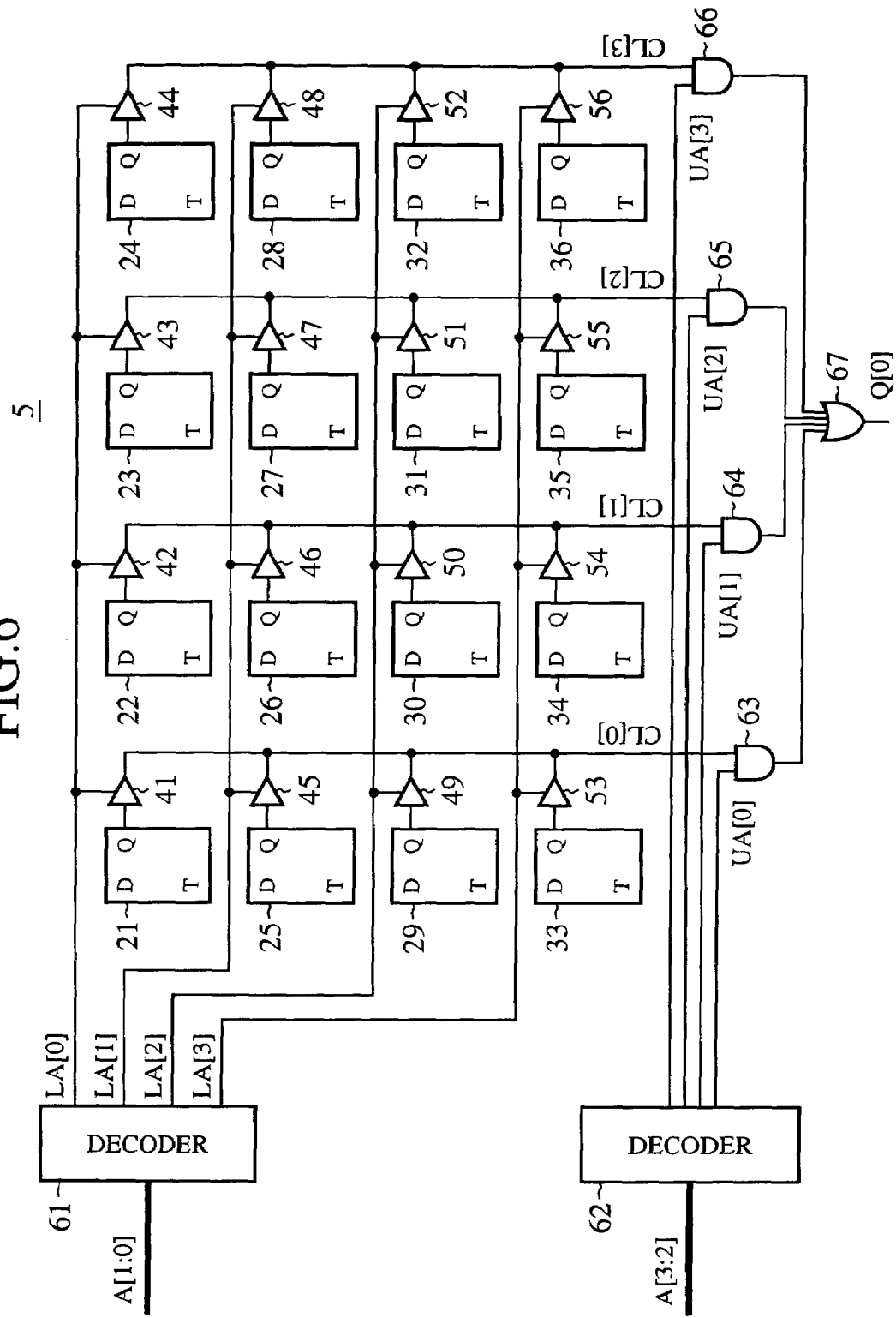
FIG. 6 is a circuit diagram showing a configuration of the memory of an embodiment 5 of the semiconductor integrated circuit in accordance with the present invention.

FIG. 6 is a circuit diagram showing a configuration of the memory 5 of an embodiment 5 of the semiconductor integrated circuit in accordance with the present invention. FIG. 6 shows a 16-word×1-bit single-port memory 5.

In FIG. 6, D-latches 21–36 each store data D[0] output from the logic circuit 3, and supply the stored data to tristate buffers 41–56. The tristate buffers 41–56 are connected to Q terminals of the D-latches 21–36, respectively. When one of decoded signals LA[0]–LA[3] of a lower address [1:0] becomes logic-H, four D-latches in one of four rows consisting of the 16 D-latches 21–36 supply their output data to AND gates 63–66 as data CL[0]–CL[3]. Although the D-latches 21–36 and tristate buffers 41–56 constitute a data holding section, the circuits connected to the D terminals and T terminals of the D-latches 21–36 are omitted from FIG. 6 (see FIGS. 2–5).

A 2-bit decoder 61 generates the decoded signals LA[0]–LA[3] from a lower address [1:0], and a 2-bit decoder 62 generates decoded signals UA[0]–UA[3] from an upper address [3:2].

The AND gates 63–66 supply an OR gate 67 with ANDs of the decoded signals UA[0]–UA[3] and the CL[0]–CL[3] output from the tristate buffers 41–56, respectively. The OR gate 67 supplies the logic circuit 4 with an OR of the ANDs of the AND gates 63–66 as data Q[0]. The AND gates 63–66 and OR gate 67 constitute a selecting section.

Next, the operation of the present embodiment 5 will be described.

Assume that one of the 16 words (0th word to 15th word) output from the logic circuit 3, data D[0] of the first word, for example, is to be written into the memory 5. In this case, the data D[0] is supplied to the D terminal of the D-latch 25. Then, the logic-H read write signal WE is supplied to the control signal generator 11 as in the foregoing embodiment 1, thus storing the data D[0] to the D-latch 25.

In this connection, to write data D[0] of the zeroth, second or fourth word to the memory 5, the data D[0] is supplied to the D terminal of the D-latch 21, 29 or 22, respectively.

On the other hand, to read the-first word data from the memory 5, the lower address [1:0] indicating the first word is supplied to the 2-bit decoder 61, and the upper address [3:2] indicating the first word is supplied to the 2-bit decoder 62.

Thus, the decoder 61 generates the decoded signals LA[0]=L, LA[1] H, LA[0]=L, LA[0]=L, and the decoder 62 generates the decoded signals UA[0]=H, UA[1]=L, UA[0]=L, UA[0]=L.

As a result, the tristate buffer 45, which is connected to the Q terminal of the D-latch 25, is supplied with the logic-H decoded signal LA[1], so that it supplies the data output from the Q terminal of the D-latch 25 to the AND gate 63 as the CL[0] The AND gate 63 receives the data CL[0] from the tristate buffer 45, and at the same time receives the logic-H decoded signal UA[0] from the decoder 62. Accordingly, the AND gate 63 directly supplies the data CL[0] to the OR gate 67.

Since the AND gates 64–66 other than the AND gate 63 receive the logic-L decoded signals UA[1]–UA[3] from the decoder 62, they supply the logic-L signals to the OR gate 67.

Receiving the data CL[0] from the AND gate 63 and logic-L signals from the AND gates 64–66, the OR gate 67 outputs the data CL[0] to the logic circuit 4 as the data Q[0].

According to the present embodiment 5, the memory 5 is configured with the standard logic cells such as the D-latches, tristate buffers, AND gates and an OR gate. Consequently, as the foregoing embodiment 1, it offers an advantage of being able to construct the memory 5 placeable in the same logic region 1 as the logic circuits 3 and 4.

In addition, when applying the memory to the 16 word data, for example, the output data lines of the tristate buffers 41–56 are divided into four lines. Thus, the present embodiment 5 offers an advantage of being able to reduce the driving power of the tristate buffers 41–56 and to shrink the circuit scale.

Embodiment 6

Figure 7:
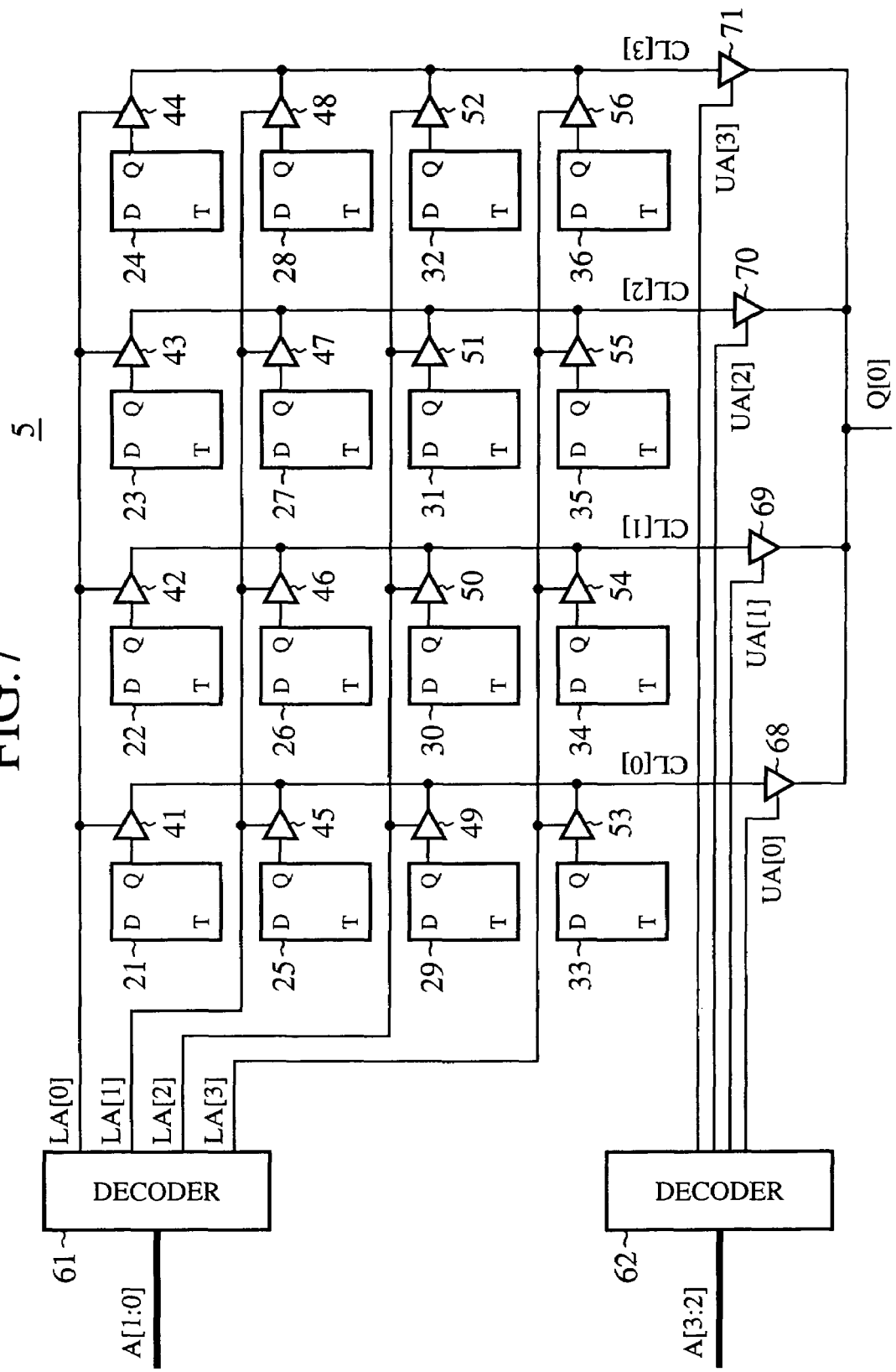
FIG. 7 is a circuit diagram showing a configuration of the memory of an embodiment 6 of the semiconductor integrated circuit in accordance with the present invention.

Although the selecting section is configured with the AND gates 63–66 and OR gate 67 in the foregoing embodiment 5, it can be constructed using tristate buffers 68–71 as shown in FIG. 7.

Thus configuring the selecting section with the tristate buffers 68–71 offers an advantage of being able to further reduce the circuit scale than the foregoing embodiment 5 using the AND gates 63–66 and OR gate 67.

Embodiment 7

Figure 8:
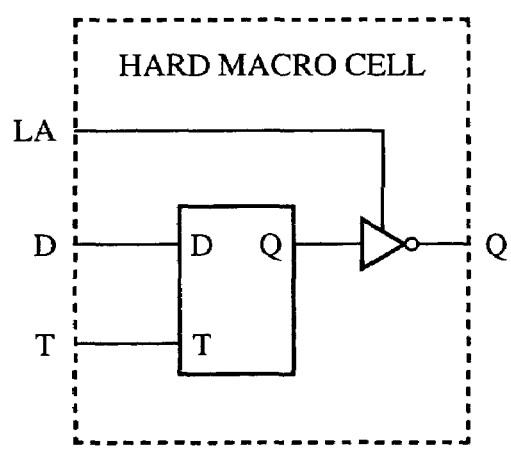
FIG. 8 is a circuit diagram showing a configuration of a D-latch and a tristate buffer formed into a hard macro cell.

Although the data holding section is configured with the D-latches and tristate buffers in the foregoing embodiment 5, it can be constructed using hard macro cells, each of which including a D-latch (or flip-flop) and tristate buffer formed into a hard macro cell as shown in FIG. 8.

As for a standard data holding section, using hard macro cells does not complicate its design, and can further reduce the circuit scale than using the logic cells. Accordingly, constructing the memory 5 by arraying a lot of standard data holding sections offers an advantage of being able to reduce the circuit scale of the memory 5 in its entirety without prolonging the design period.

Embodiment 8

Figure 9:
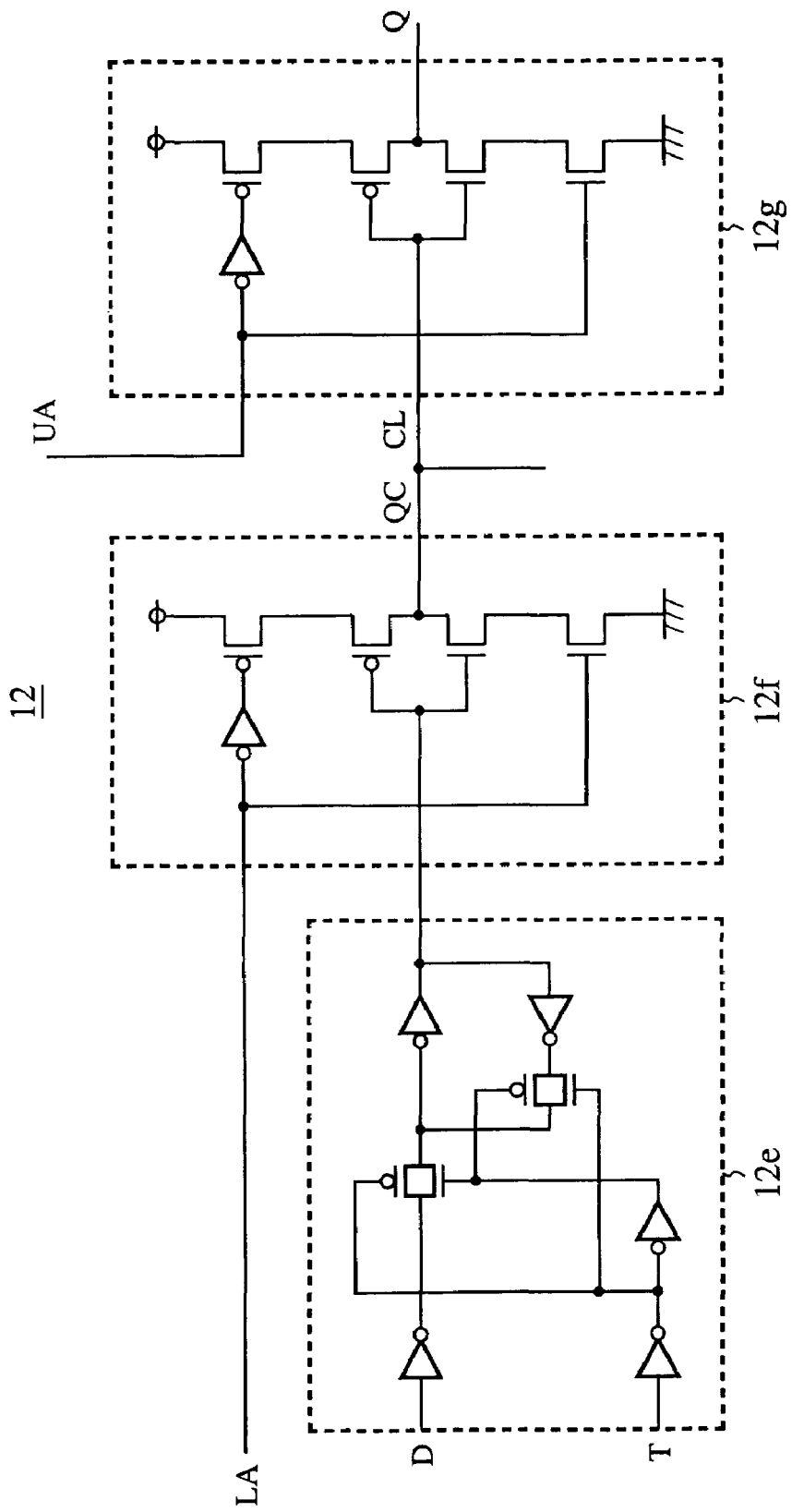
FIG. 9 is a circuit diagram showing a configuration of a data holder.

Although the data holding section in the foregoing embodiment 7 is configured with the hard macro cells, each of which is formed by the D-latch and tristate buffer, this is not essential. For example, as shown in FIG. 9, the data holder 12 can be configured with a data storage 12e consisting of a hard macro cell, an output controller 12f and an inverting output controller 12g. In this case, the data storage 12e corresponds to the D-latch of FIG. 8, the output controller 12f corresponds to the tristate buffer (tristate buffer with an inverting function) of FIG. 8, and the inverting output controller 12g corresponds to the tristate buffer (tristate buffer with an inverting function) of FIG. 7.

In the data read mode, the data storage 12e supplies its stored data to the output controller 12f. The output controller 12f supplies the inverted value QC of the data to the inverting output controller 12g. The inverting output controller 12g further inverts the inverted value QC and outputs the data Q.

In the mode other than the data read mode, the output controller 12f outputs the high-impedance value as the QC.

The present embodiment 8 offers an advantage of being able to reduce the circuit scale.

Embodiment 9

Figure 10:
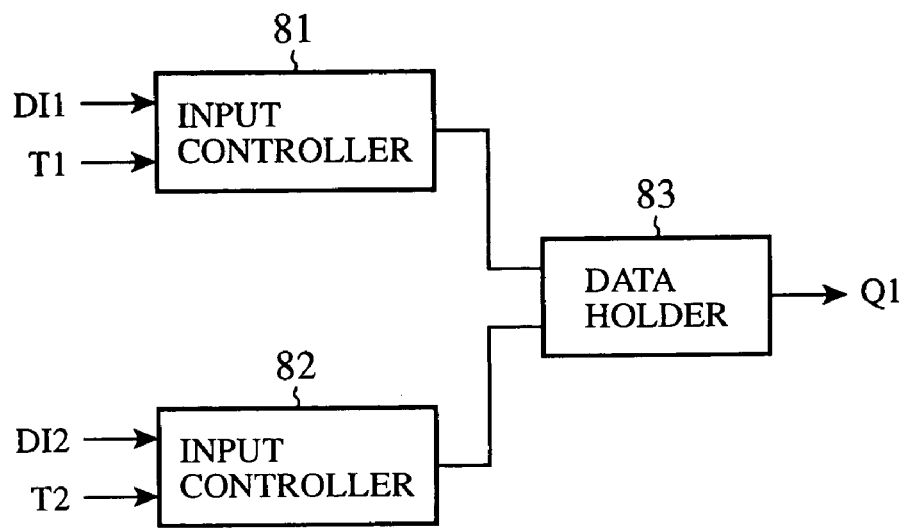
FIG. 10 is a block diagram showing a configuration of a data holding section of the memory of an embodiment 9 in accordance with the present invention.

FIG. 10 is a block diagram showing a configuration of the data holding section of the memory 5 of an embodiment 9 in accordance with the present invention. In FIG. 10, an input controller 81 loads the data DI1 in synchronism with the clock T1, and supplies the data DI1 to a data holder 83. Likewise, an input controller 82 loads the data DI2 in synchronism with the clock T2, and supplies the data DI2 to a data holder 83. The input controllers 81 and 82 and the data holder 83 constitute the data holding section.

Figure 11:
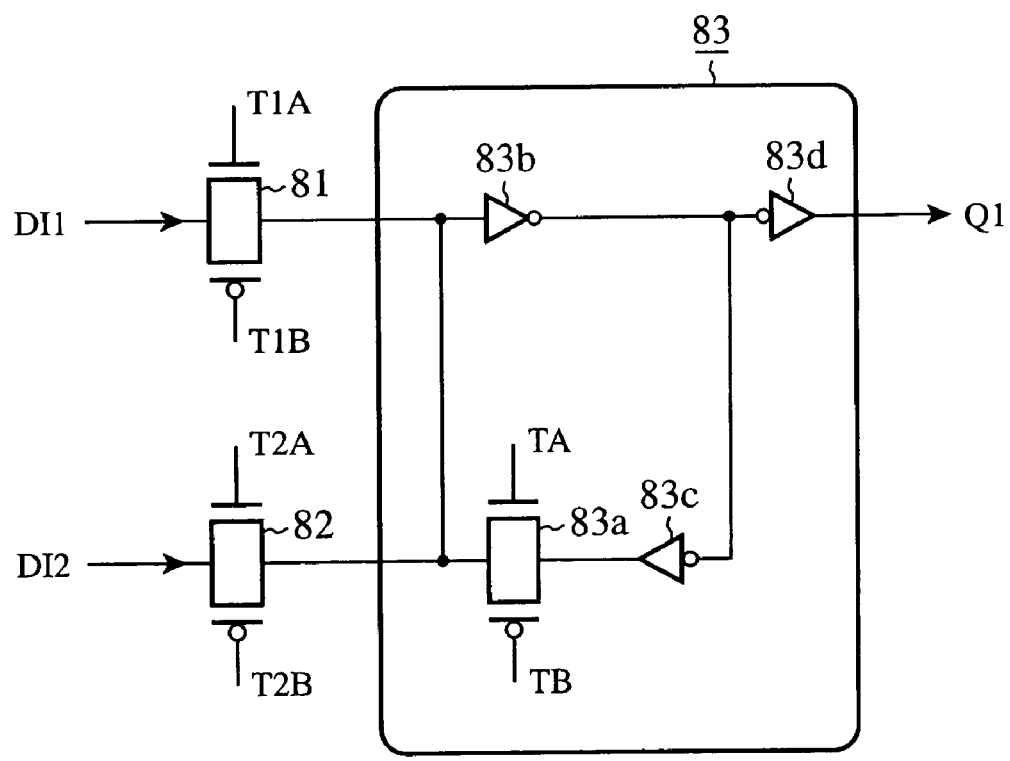
FIG. 11 is a circuit diagram showing a configuration of a data holding section of the memory of the embodiment 9 in accordance with the present invention.
Figure 12A:
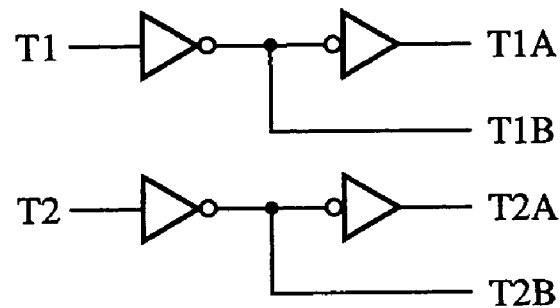
FIGS. 12A and 12B are circuit diagrams each showing a configuration of a clock control circuit.

As shown in FIG. 11, the input controller 81 is composed of a TG (transmission gate), for example, and supplies the data DI1 to the data holder 83 only when the clock T1 is at the logic-H (see FIG. 12A showing a clock control circuit).

Likewise, as shown in FIG. 11, the input controller 82 is composed of a TG (transmission gate), for example, and supplies the data DI2 to the data holder 83 only when the clock T2 is at the logic-H (see FIG. 12A).

It is assumed here that the clock T2 is controlled to take logic-L when the clock T1 is at logic-H, and that the clock T1 is controlled to take logic-L when the clock T2 is at logic-H.

Figure 12B:
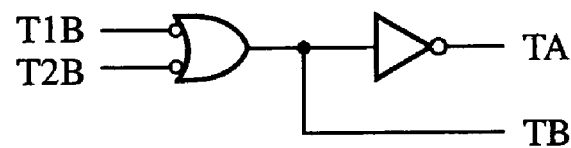

The clock control circuits as shown in FIGS. 12A and 12B can be incorporated into the input controllers 81 and 82, or can be installed outside the input controllers 81 and 82.

As shown in FIG. 11, the data holder 83 is configured with a TG 83a and inverters 83b, 83c and 83d. When either the input controller 81 or 82 outputs data, the TG 83a is closed. In contrast, when none of the input controllers 81 and 82 outputs data, the TG 83a is opened (see FIG. 12B), thereby enabling the data DI1 and DI2 to be held.

Thus, the two input ports enable reading data through one of them to be stored.

In addition, configuring the input controllers 81 and 82 and the data holder 83 with the hard macro cells can reduce the circuit scale.

Figure 13:
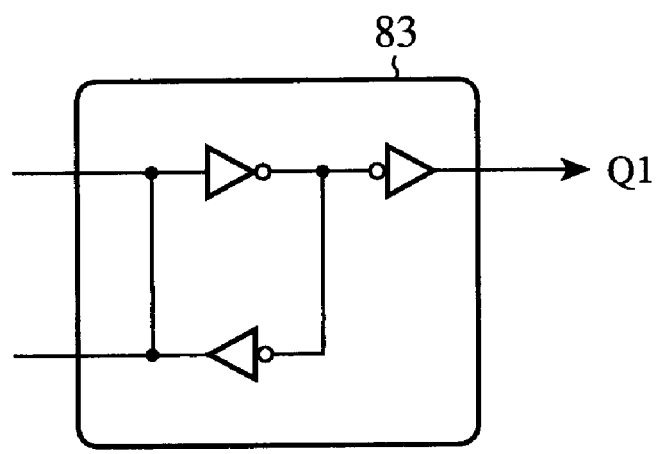
FIG. 13 is a circuit diagram showing a configuration of a data holder.

Incidentally, configuring the data holder 83 with a ratio circuit as shown in FIG. 13 can further reduce the circuit scale.

Embodiment 10

Although the foregoing embodiment 9 employs the clock control circuits as shown in FIGS. 12A and 12B to control the clock signals supplied to the input controllers 81 and 82 and the data holder 83, this is not essential. For example, the clock control circuits can be configured as shown in FIGS. 14A and 14B.

Figure 14A:
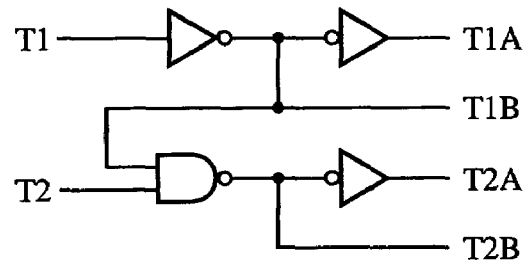
FIGS. 14A and 14B are circuit diagrams each showing a configuration of a clock control circuit.
Figure 14B:
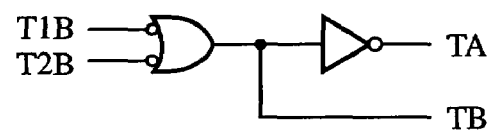

Using the clock control circuits as shown in FIGS. 14A and 14B enables writing the data DI2 into the data holder 83 only when the clock T1 becomes logic-L. Thus, it can positively prevent the write error even if both the clock signals T1 and T2 become logic-H accidentally.

Embodiment 11

Figure 15:
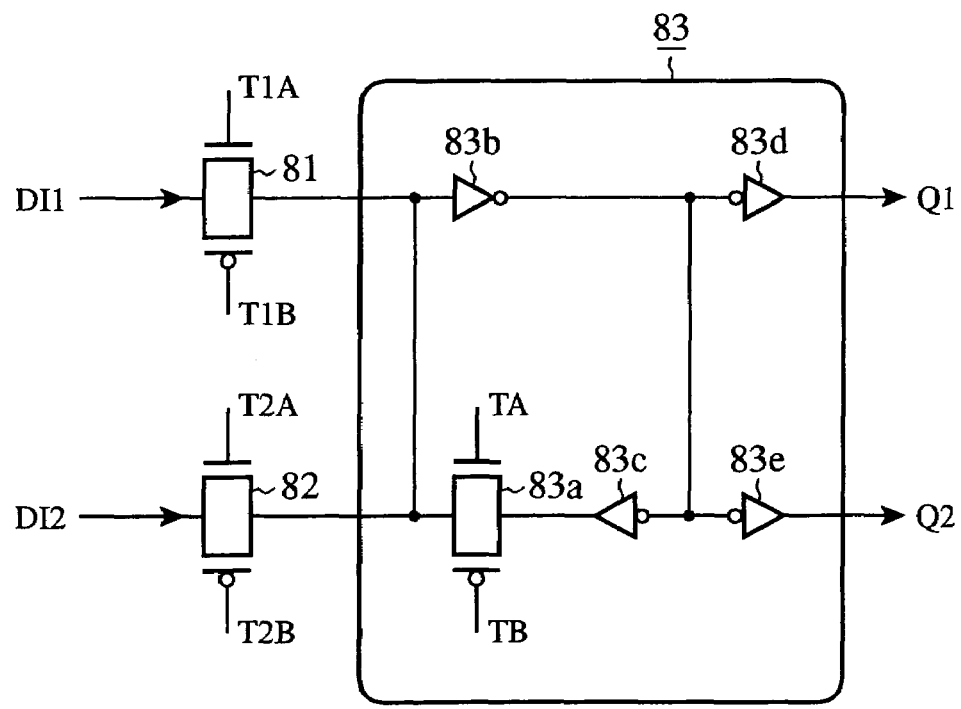
FIG. 15 is a circuit diagram showing a configuration of a data holding section of the memory of an embodiment 11 in accordance with the present invention.

Although the data holder 83 is configured with the TG 83a and inverters 83b, 83c and 83d in foregoing embodiment 9, this is not essential. For example, as shown in FIG. 15, an inverter 83e may be added.

Thus, the present embodiment 11 can output the data held in the data holder 83 to a plurality of ports. As a result, it offers an advantage of being able to reduce the number of the data holders 83 and hence shrink the circuit scale, when the memory 5 must have a plurality of output ports.

Embodiment 12

Figures 16A, 16B:
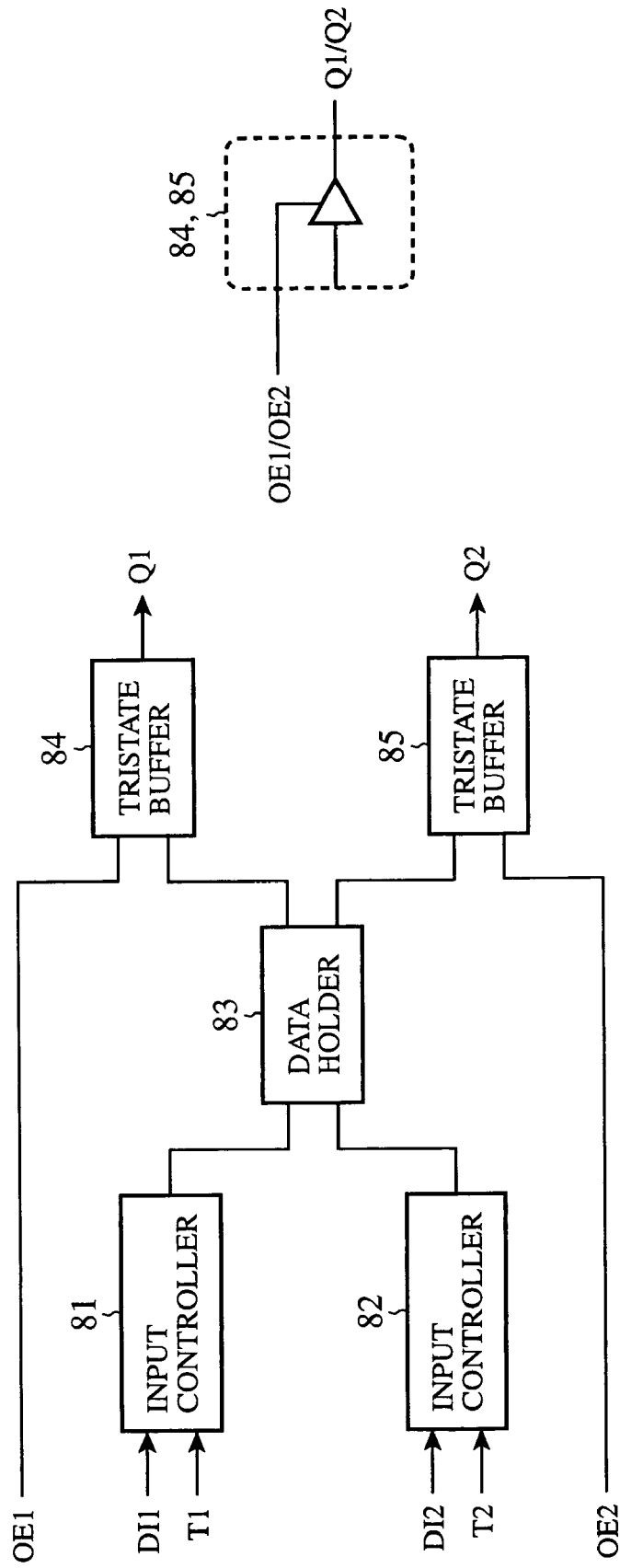
FIGS. 16A and 16B are circuit diagrams showing a configuration of a data holding section of the memory of an embodiment 12 in accordance with the present invention.

Although the data holder 83 outputs its stored data to a plurality of ports in the foregoing embodiment 11, this is not essential. For example, as shown in FIG. 16A, tristate buffers 84 and 85 can be connected to the output side of the data holder 83.

Figure 17:
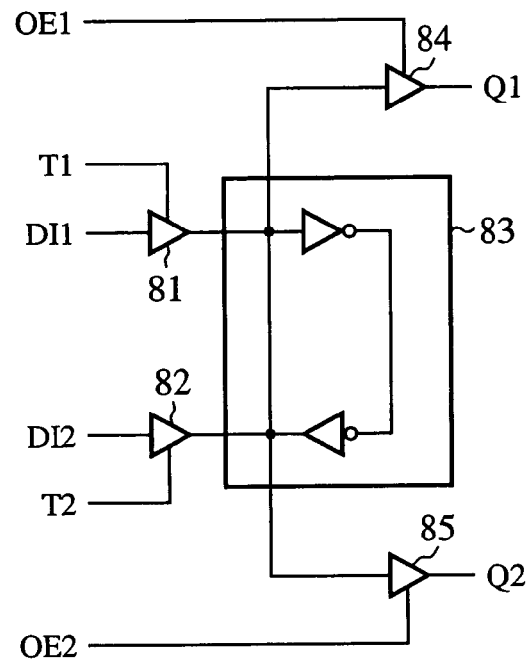
FIG. 17 is a circuit diagram showing a configuration of a data holding section of the memory of an embodiment 12 in accordance with the present invention.

Alternatively, as shown FIG. 17, the data holder 83 can be configured with ratio circuits and the input controllers 81 and 82 are configured with tristate buffers. The configuration offers an advantage of being able to further reduce the circuit scale.

Embodiment 13

Figure 18:
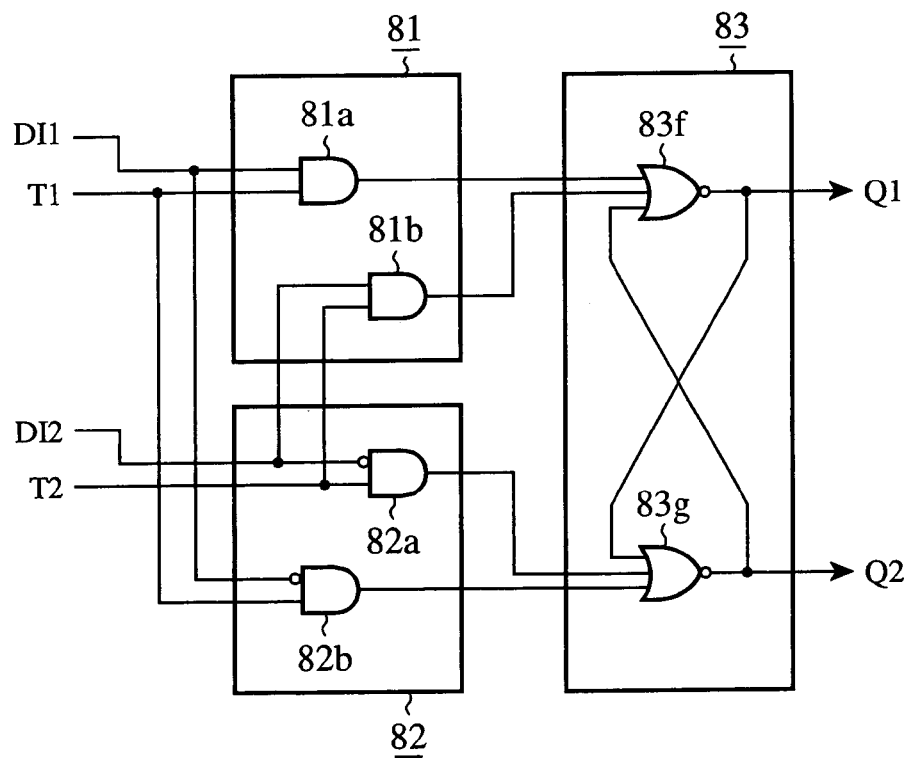
FIG. 18 is a circuit diagram showing a configuration of a data holding section of the memory of an embodiment 13 in accordance with the present invention.

Although the data holder 83 is configured with the TG 83a and the inverter 83b–83e in the foregoing embodiment 11, this is not essential. For example, as shown in FIG. 18, the data holder 83 can be configured with a cross-coupling of NOR gates 83f and 83g, and the input controllers 81 and 82 can be configured with AND gates 81a, 81b, 82a and 82b. Thus, the present embodiment 13 can achieve the same advantage as the foregoing embodiment 11.

In addition, the present embodiment 13 can construct the dual-port data holder 83 with only ordinary logic gates.

Embodiment 14

Figure 19A:
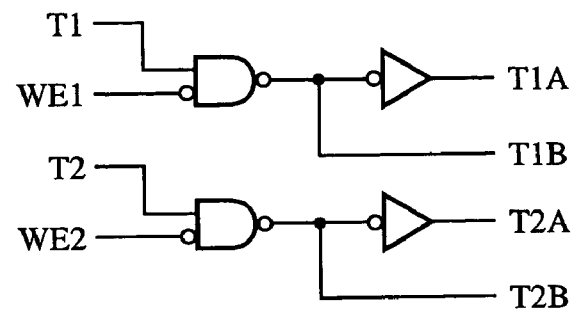
FIGS. 19A and 19B are circuit diagrams each showing a configuration of a clock control circuit.
Figure 19B:
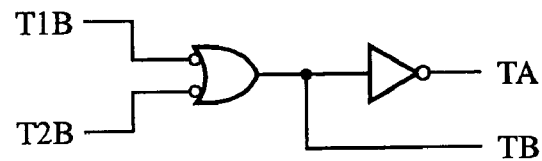

Although the clock control circuits of the foregoing embodiment 9, which control the clock signals supplied to the input controllers 81 and 82 and data holder 83, have the configurations as shown in FIGS. 12A and 12B, this is not essential. For example, the clock control circuits can be configured as shown in FIGS. 19A and 19B.

More specifically, it is configured such that the input controller 81 or 82 can supply the data DI1 or DI2 to the data holder 83 only in the write mode in which the read write signal WE is at logic-L.

In this case, since the read write signal WE controls the write operation, the clock signals T1 and T2 can be a free-running clock signal, thereby facilitating the design of the clock signals T1 and T2.

Embodiment 15

Figure 20:
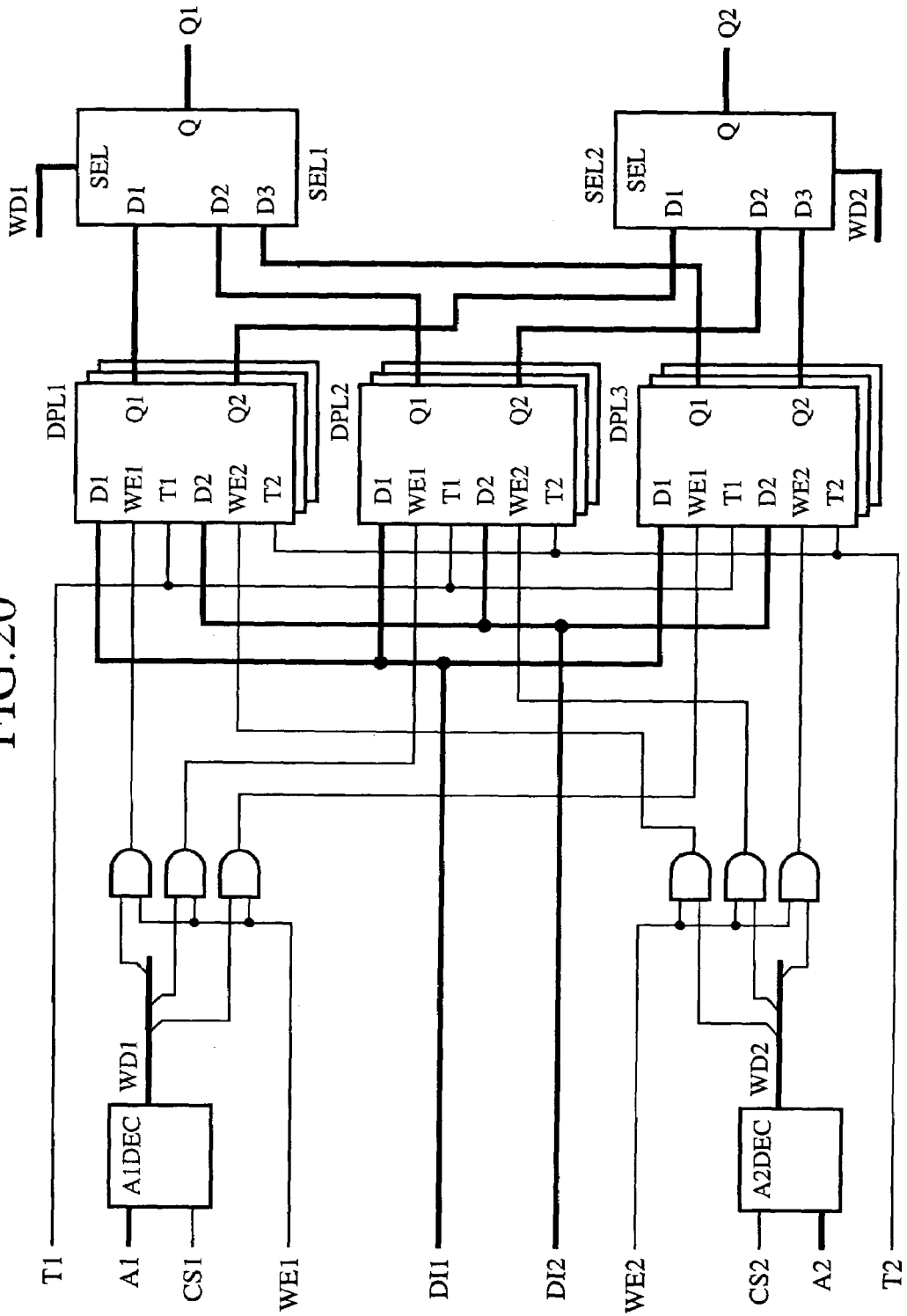
FIG. 20 is a circuit diagram showing a configuration of a dual-port SRAM.

Although the foregoing embodiments 11–13 handle the data holding section of the dual-port memory 5, it is possible to configure the data holding section (indicated by DPL in FIG. 20) of the dual-port memory 5 with a hard macro, and to configure its remaining peripheral circuits such as address decoder (DEC) and output selector (SEL) with ordinary logic gates, thereby being able to construct a soft-macro dual-port SRAM by wiring them as shown in FIG. 20.

This enables the dual-port memory to be constructed in the logic region 1, and offers an advantage of being able to reduce the area and power consumption.

Figure 21:
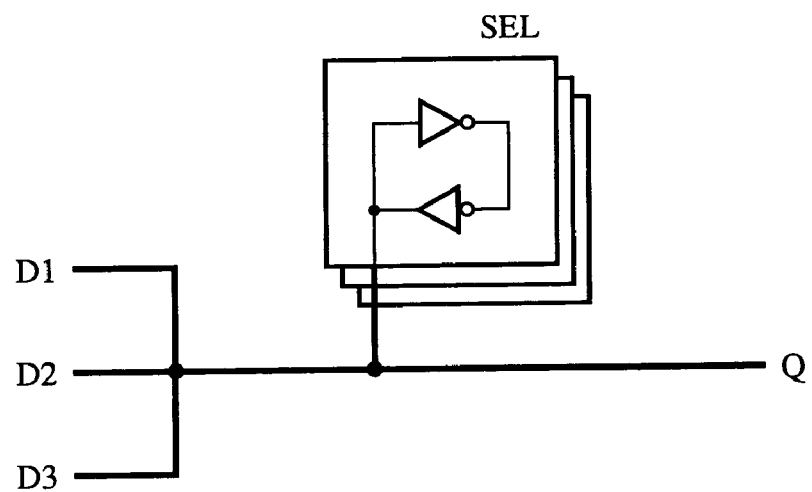
FIG. 21 is a circuit diagram showing a configuration of an output selector of FIG. 20.

Although FIG. 20 does not show a concrete configuration of the output selectors SEL, they can be configured with a ratio-latch-type level holding circuit as shown in FIG. 21. Even if the control timing of the data D1, D2 and D3 is lost, and the output side Q of the output selector SEL is brought into a high-impedance value, the present embodiment 15 can reduce the flow-through current flowing through a driver at the receiving side of the output Q. Consequently, it offers an advantage of being able to implement a lower power consumption.

Figure 22:
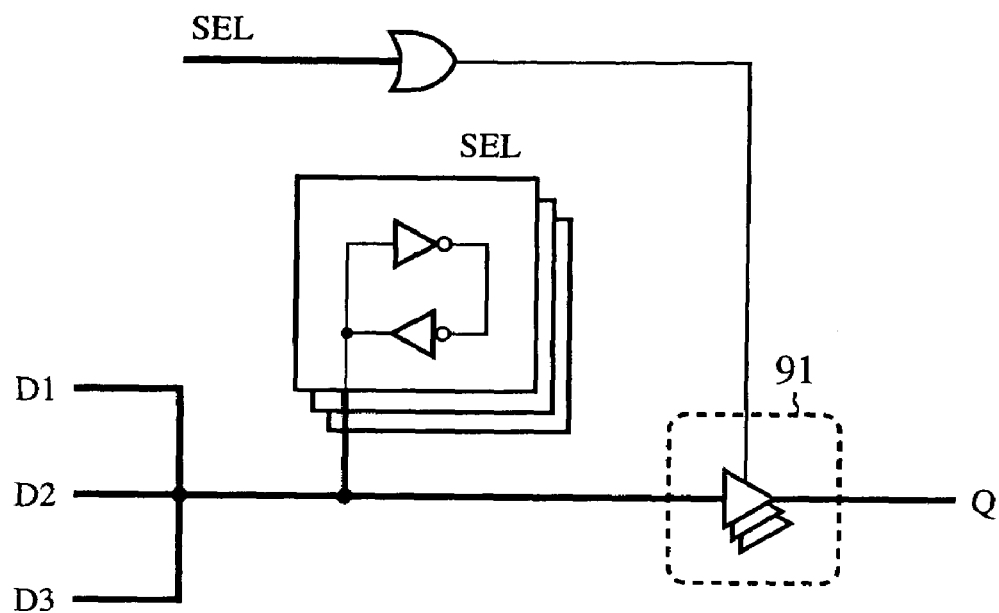
FIG. 22 is a circuit diagram showing a configuration of the output selector of FIG. 20.

Furthermore, it is also possible to install a driver 91 for outputting the data stored in the ratio-latch-type level holding circuit to the output line connected to the Q terminal at high driving power (see, FIG. 22). The driver 91 divides the output line connected to the Q terminal, and hence reduces load capacity such as wiring capacity and gate capacity, thereby increasing the data transmission rate. Instead of the driver 91, a tristate buffer can be used, which enables reducing the area.

Figure 23:
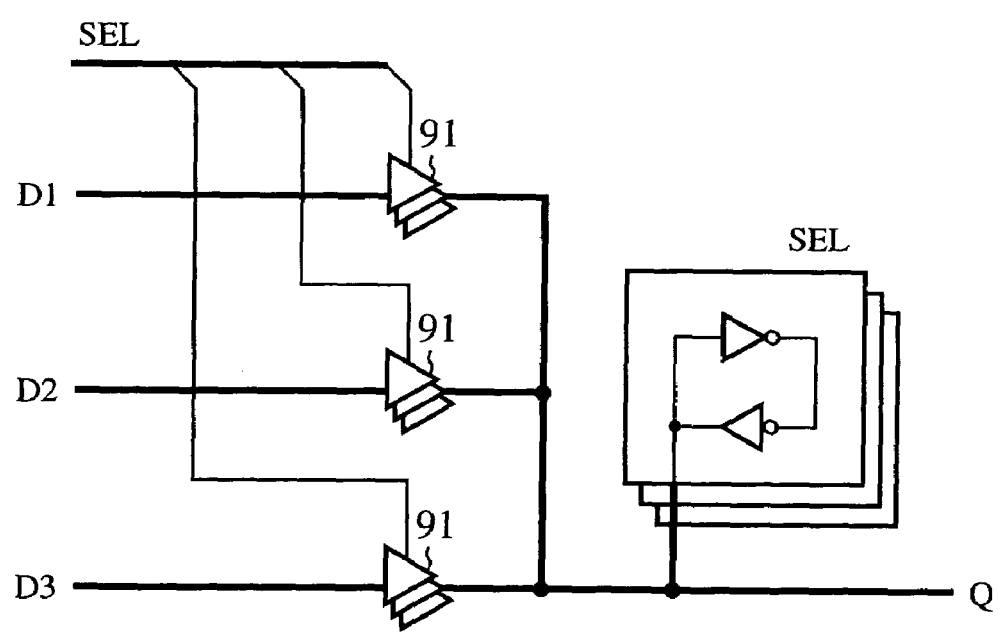
FIG. 23 is a circuit diagram showing a configuration of the output selector of FIG. 20.

In addition, instead of connecting the driver 91 to the Q output line, drivers 91 can be installed in the positions shown in FIG. 23. The configuration offers an advantage of being able to increase the data transmission rate.

Embodiment 16

Figure 24:
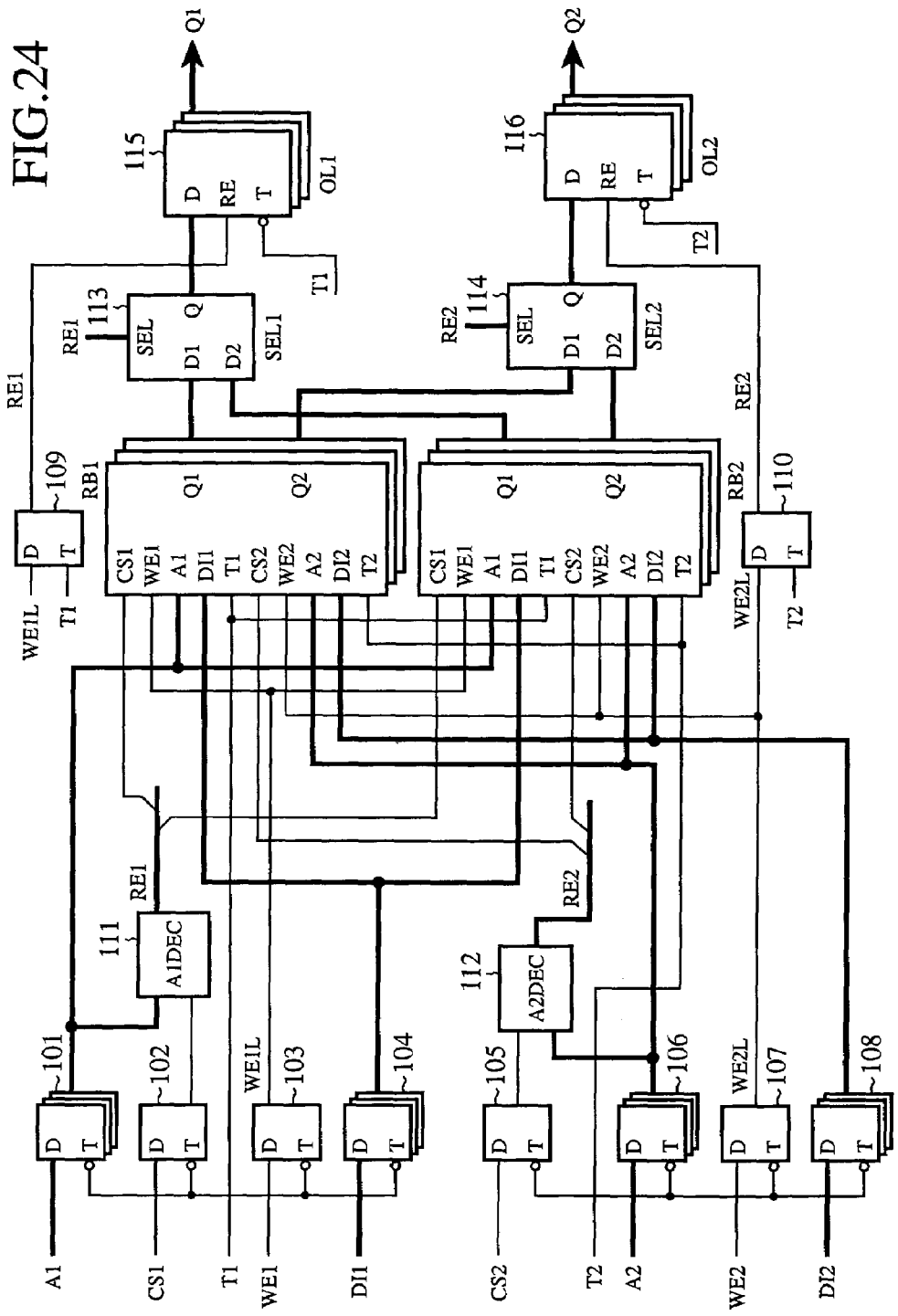
FIG. 24 is a circuit diagram showing a configuration of a synchronous dual-port memory.

FIG. 24 shows a configuration of a synchronous dual-port memory (2RW) constructed by placing a plurality of dual-port SRAMs RB of FIG. 20.

Input latches 101–110 are placed at the pre-stage of the dual-port SRAMs RB. In particular, the address A1 of the port 1 latched in the input latch 101 is fed to an address decoder 111 as well as to the A1 terminal of the dual-port SRAM RB1. Accordingly, the upper address of the port 1 is decoded by the decoder 111, and the lower address of the port 1 is decoded by a decoder in the dual-port SRAM RB1.

Likewise, the address A2 of the port 2 latched in the input latch 106 is supplied to an address decoder 112 as well as to the A2 terminal of the dual-port SRAM RB2. Accordingly, the upper address of the port 2 is decoded by the decoder 112, and the lower address of the port 2 is decoded by a decoder in the dual-port SRAM RB2.

The decoder 111 decodes the upper address of the port 1, and supplies a select signal RE1 to the dual-port SRAMs RB1 and RB2 and to a secondary selecting circuit 113. Likewise, the decoder 112 decodes the upper address of the port 2, and supplies a select signal RE2 to the dual-port SRAMs RB1 and RB2 and to a secondary selecting circuit 114.

The data Q output from the dual-port SRAMs RB1 and RB2 are selected by the secondary selecting circuits 113 and 114, and are output through output latches 115 and 116.

Thus, the present embodiment 16 can construct the synchronous dual-port memory in the logic region 1. As a result, it offers an advantage of being able to reduce the area and power consumption.

Embodiment 17

Figure 25:
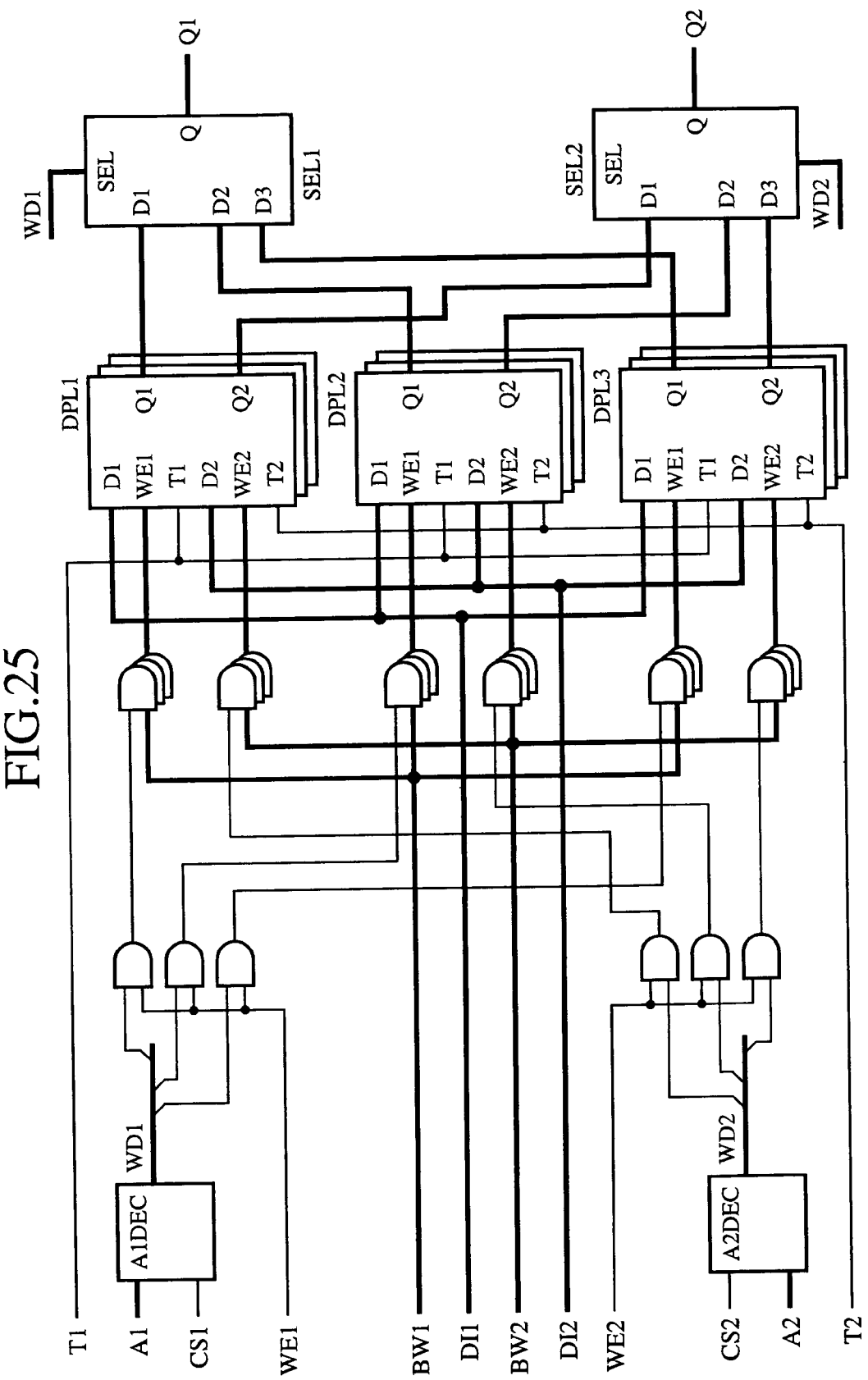
FIG. 25 is a circuit diagram showing a configuration of a dual-port SRAM.

FIG. 25 shows a configuration of a dual-port SRAM. It differs from the configuration of FIG. 20 in that it comprises AND gates in the previous stage of the data holding sections DPLs. The AND gates outputs ANDs of the bit masking signals BW1 and BW2 and the output signals of the address decoders.

The AND gates operate as follows. Even if the output signals of the address decoders select specified data, placing the bit masking signals BW1 and BW2 at logic-L brings about non-selecting state, thereby preventing the bits of the specified data from being written.

Accordingly, the present embodiment 17 offers an advantage of being able to implement bit-by-bit write control.

Figure 26:
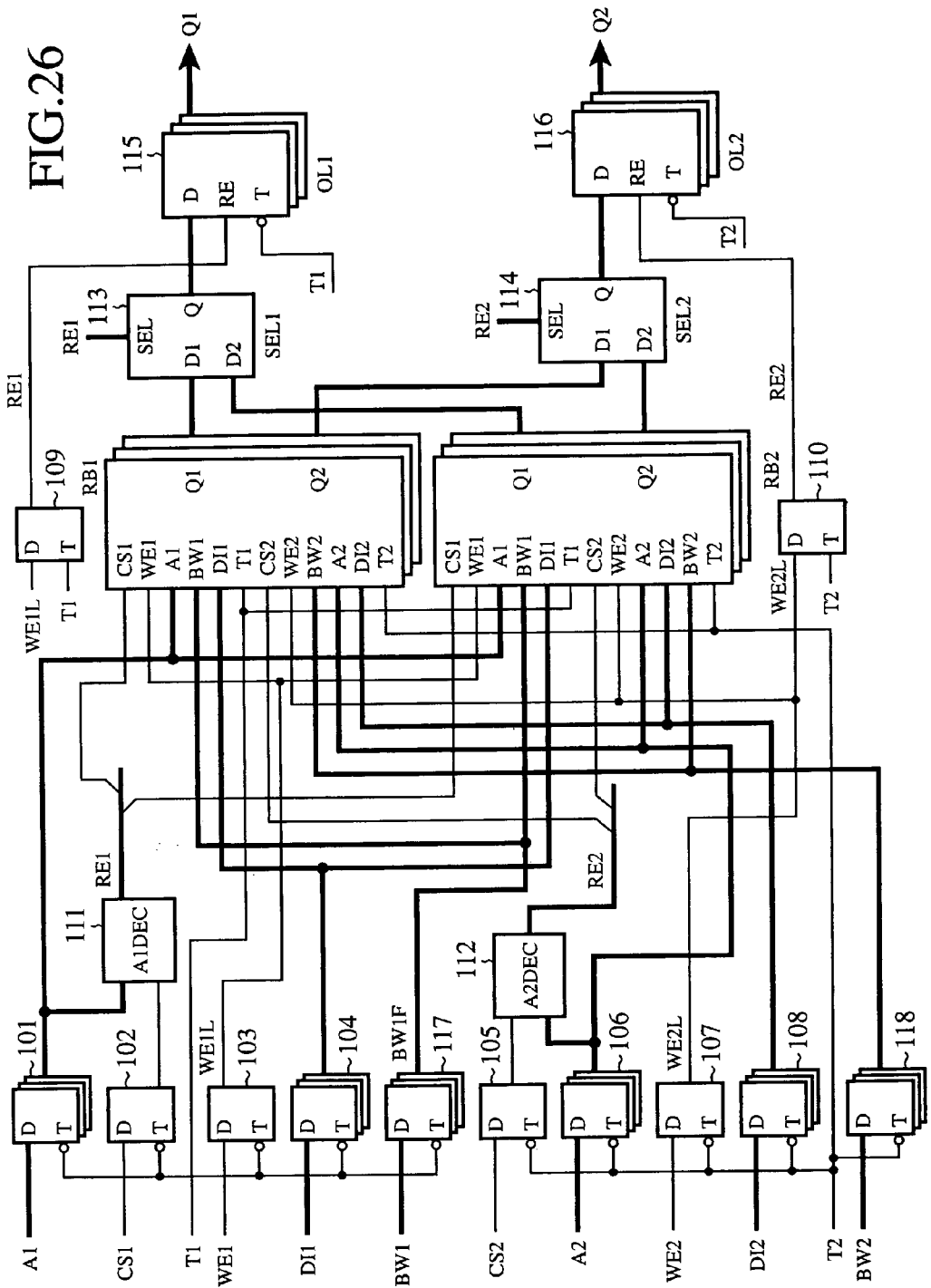
FIG. 26 is a circuit diagram showing a configuration of a synchronous dual-port memory.

FIG. 26 shows a configuration of a synchronous dual-port memory (2RW) constructed by placing a plurality of dual-port SRAMs RB of FIG. 25.

It differs from the configuration of FIG. 24 in that it includes input latches 117 and 118 for latching the bit masking signals BW1 and BW2, and for supplying them to the write control terminals BW of the dual-port SRAMs RB.

Embodiment 18

Figure 27:
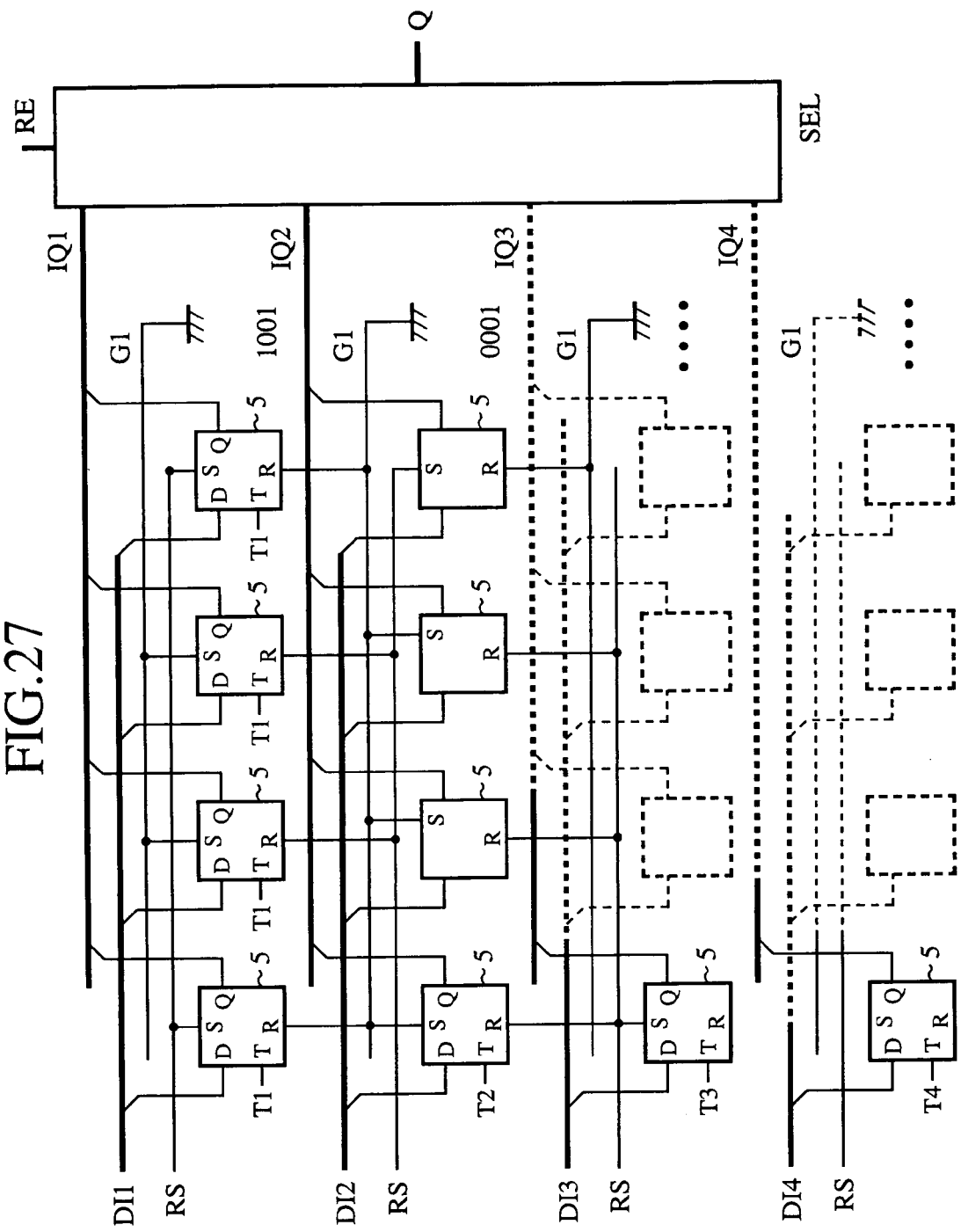
FIG. 27 is a circuit diagram showing a configuration of an SRAM including single-port memories disposed in an array.

FIG. 27 shows an SRAM composed of m-word×n-bit single-port memories 5 arranged in an array. The single-port memories 5 can be the memory as shown in FIG. 2, if they are a 2-word×2-bit single-port memory. Here, the memories 5 are each provided with a set terminal and a reset terminal, one of which is supplied with a reset signal RS, and the other of which is fixed to the nonactive logic level.

With the foregoing configuration, the initializing of the SRAM of FIG. 27 can be implemented by supplying the reset signal RS from the outside. Consequently, implementing the memories 5 with the hard macro makes it possible to create the initializing program at the step of designing the netlist or functions. Thus, the present embodiment 18 can easily add the initializing function to the SRAM.

Embodiment 19

Figure 28:
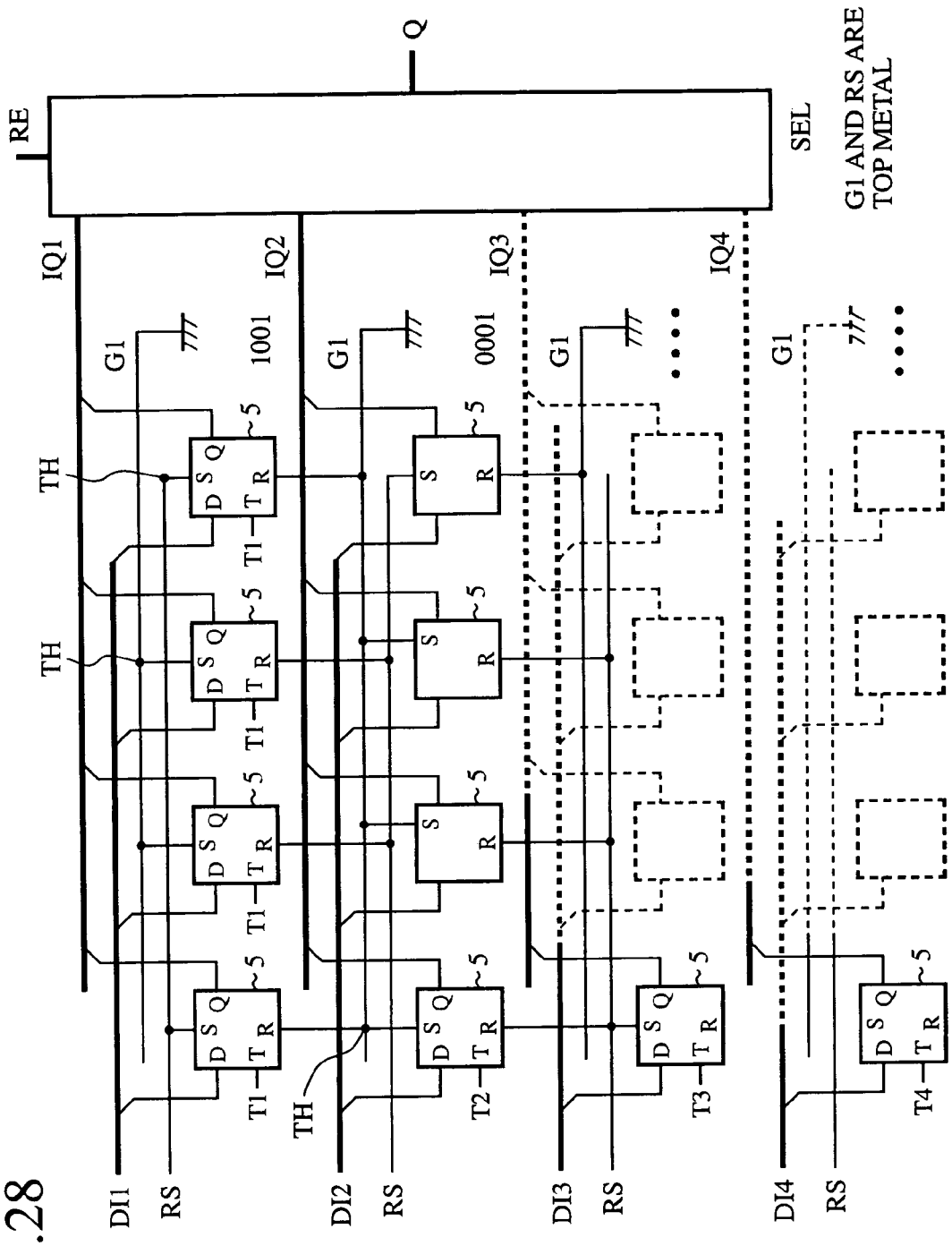
FIG. 28 is a circuit diagram showing a configuration of an SRAM including single-port memories disposed in an array.

Although the foregoing embodiment 18 does not mention, a configuration is also possible which implements connection lines of the ground G1 and connection lines of the reset signal RS with metal patterns on the top layer, and connecting the set/reset terminals to the metal patterns via through holes TH as shown in FIG. 28.

This enables programming with the top layer and through holes TH, thereby being able to facilitate a revision after prototyping by a process unit such as an FIB (Focused Ion Beam) processor, and to reduce a fabrication period TAT (Turn Around Time) at the revision.

Embodiment 20

Figure 29:
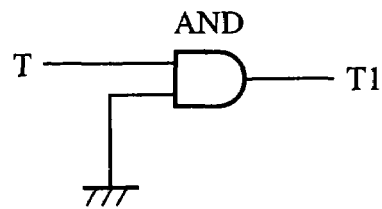
FIG. 29 is a circuit diagram showing a configuration of a clock control circuit.

Although the foregoing embodiments 18 and 19 handle the case where the clock signals T1 and T2, T3 and T4 fed to the memory 5 alternate high and low signal levels at a predetermined period, this is not essential. For example, as for the clock T1, its signal level can be fixed at the low level as shown in FIG. 29.

Thus, the memory 5 fed with the clock T1 continues holding the initial data, which means that the memory 5 functions as a ROM. Consequently, the present embodiment 20 can establish a ROM region in a part of the SRAM.

Embodiment 21

Figure 30:
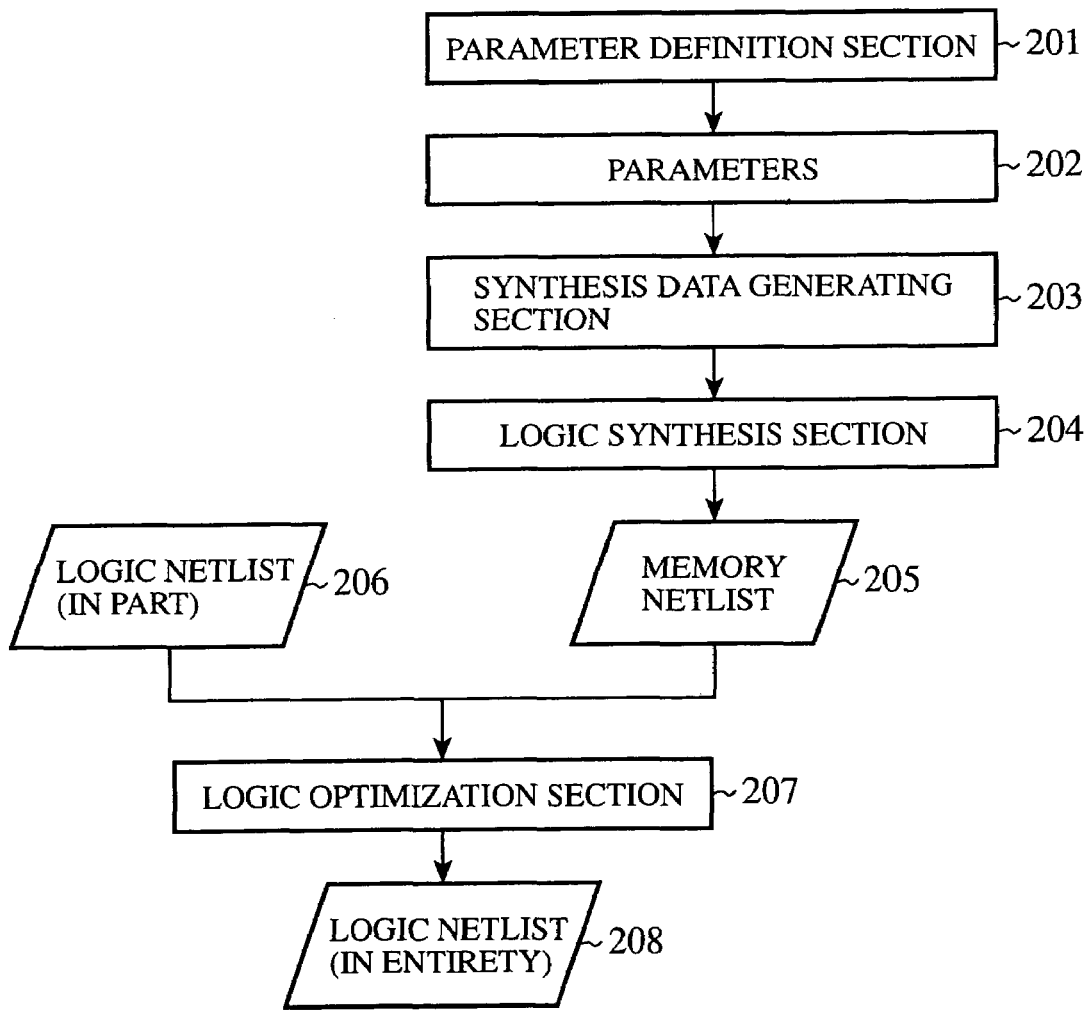
FIG. 30 is a block diagram showing a configuration of a circuit design apparatus of an embodiment 21 in accordance with the present invention.

FIG. 30 is a block diagram showing a configuration of a circuit design apparatus of an embodiment 21 in accordance with the present invention. In FIG. 30, a parameter definition section 201 defines parameters 202 of the memory 5 embedded into a semiconductor integrated circuit. A synthesis data generating section 203 generates data to be synthesized from the parameters 202 defined by the parameter definition section 201. A logic synthesis section 204 generates a netlist 205 of the memory 5 from the combined data. Here, the synthesis data generating section 203 and logic synthesis section 204 constitute a memory netlist generating section. A logic optimization section 207 carries out logic optimization processing between a netlist 206 of the logic section other than the memory and the netlist 205 generated by the logic synthesis section 204, and generates a netlist 208 of the semiconductor integrated circuit.

Next, the operation of the present embodiment 21 will be described.

The circuit design apparatus of FIG. 30 carries out the circuit design of the semiconductor integrated circuit of FIG. 1. First, a user manipulates the parameter definition section 201 to define the parameters 202 of the memory 5 to be embedded into the semiconductor integrated circuit.

More specifically, the parameters 202 of the memory 5 define the number of the words, number of bits and functions of the memory 5. For example, the following items are defined.

parameter word=16;
    parameter bit=16;
    port0_func read/write;
    port1_func read/write;

Once the parameter definition section 201 has defined the parameters 202, the synthesis data generating section 203 generates the data to be synthesized from the number of words and the number of bits of the memory 5. The data to be synthesized are generated in an RTL (Register Transfer Level) of the Verilog HDL (Hardware Description Language) as illustrated in FIG. 31, for example.

Once the synthesis data generating section 203 has generated the data to be synthesized, the logic synthesis section 204 carries out the logic synthesis of the data to be synthesized, and generates the netlist 205 of the memory 5. The netlist 205 of the memory 5 is generated in a netlist form of the Verilog HDL (Hardware Description Language) as illustrated in FIG. 32, for example.

Once the logic synthesis section 204 has generated the netlist 205 of the memory 5, the logic optimization section 207 carries out the logic optimization processing between the netlist 206 of the logic section other than the memory and the netlist 205 generated by the logic synthesis section 204, and produces the netlist 208 of the semiconductor integrated circuit.

Figures 34, 35:
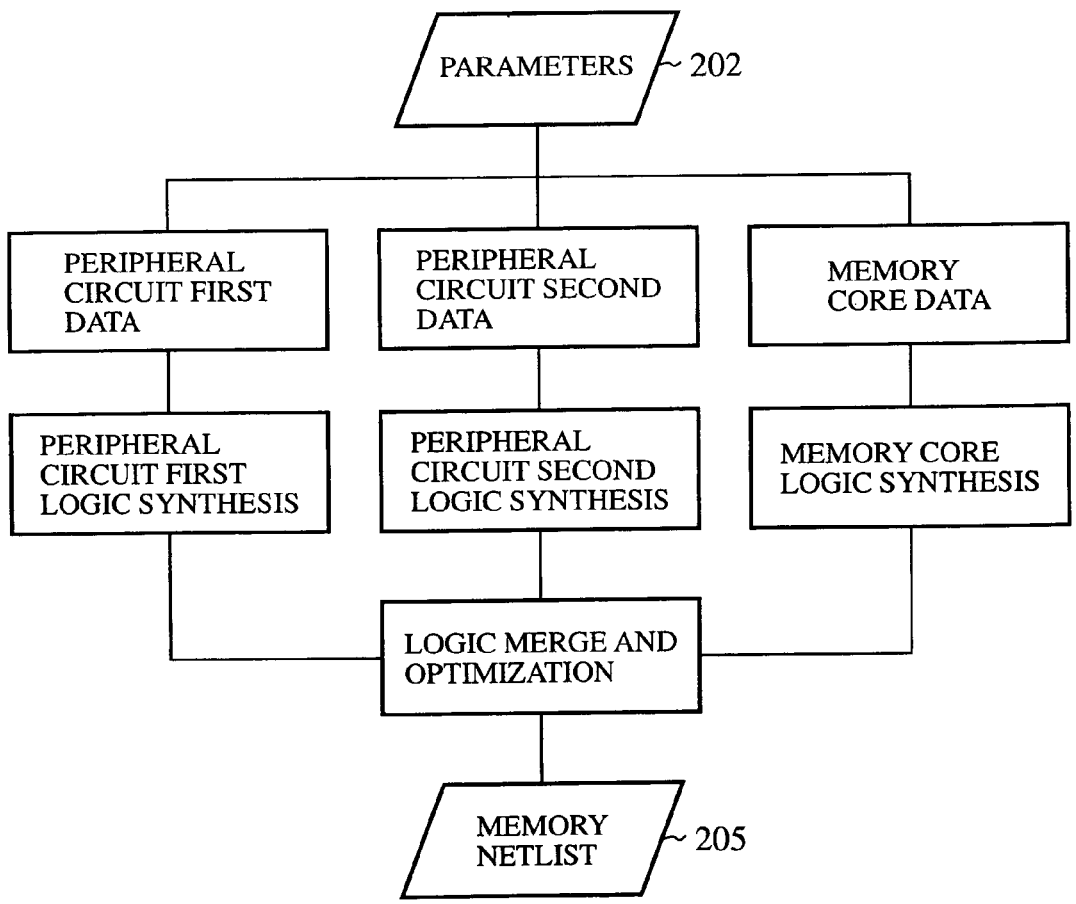
FIG. 34 is a list illustrating an example of a netlist of a semiconductor integrated circuit.
FIG. 35 is a block diagram illustrating a procedure for generating a netlist from parameters.

Incidentally, the netlist 206 of the logic section other than the memory is created in the netlist form of the Verilog HDL as shown in FIG. 33, and the netlist 208 of the semiconductor integrated circuit is generated in the netlist form of the Verilog HDL as shown in FIG. 34, for example.

Comparing the netlists before and after the optimization by the logic optimization section 207 (comparing FIG. 33 with FIG. 34), it is seen that the boundaries of the "module dpram" are logically optimized, and the logic of the input signal is inverted in part. This means that a circuit of a part of the netlist can be eliminated.

More specifically, the logic of CSC1 and WEC1 of the dpram is inverted, and INV cells U1002 and U1003 before the dpram optimization are eliminated.

The present embodiment 21 configures the memory block with the soft macro. Accordingly, it can optimize the logic in its entirety with ease, and offers an advantage of being able to reduce the design period of the semiconductor integrated circuit.

Embodiment 22

Figure 36:
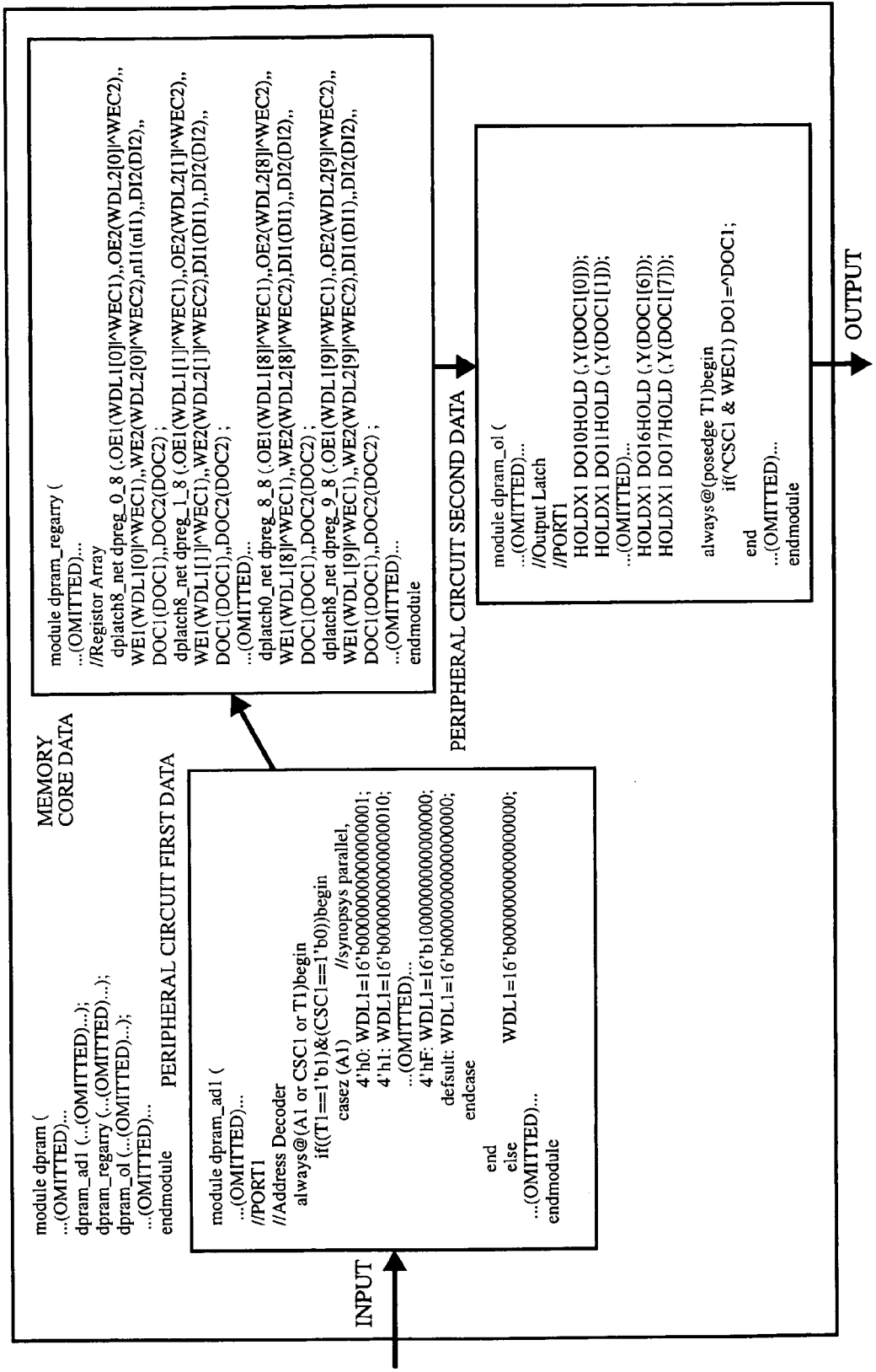
FIG. 36 is a block diagram illustrating an example of division data.

Although the foregoing embodiment 21 generates the data to be synthesized from the parameters 202, and generates the netlist 205 of the memory 5 from the data to be synthesized, a configuration as shown in FIG. 35 is also possible. More specifically, when generating the data to be synthesized from the parameters 202, it divides the parameters 202 into peripheral circuit first data (on the address decoders and the like), peripheral circuit second data (on the output control circuit such as selectors, latches and drivers), and memory core data (on the memory core section), logically synthesizes the divided data, and merges the data after the division into one whole (see, FIG. 36).

Thus dividing the parameters 202 into divisions on a block by block basis having a similar structure can reduce the complexity of the logic synthesis. In addition, since the memory core section has a simple structure, its data can be generated in a form similar to a netlist in advance. Accordingly, the present embodiment 22 offers an advantage of being able to reduce the period of time required for the logic synthesis, and hence to reduce the design period of the semiconductor integrated circuit.

Embodiment 23

Figure 37:
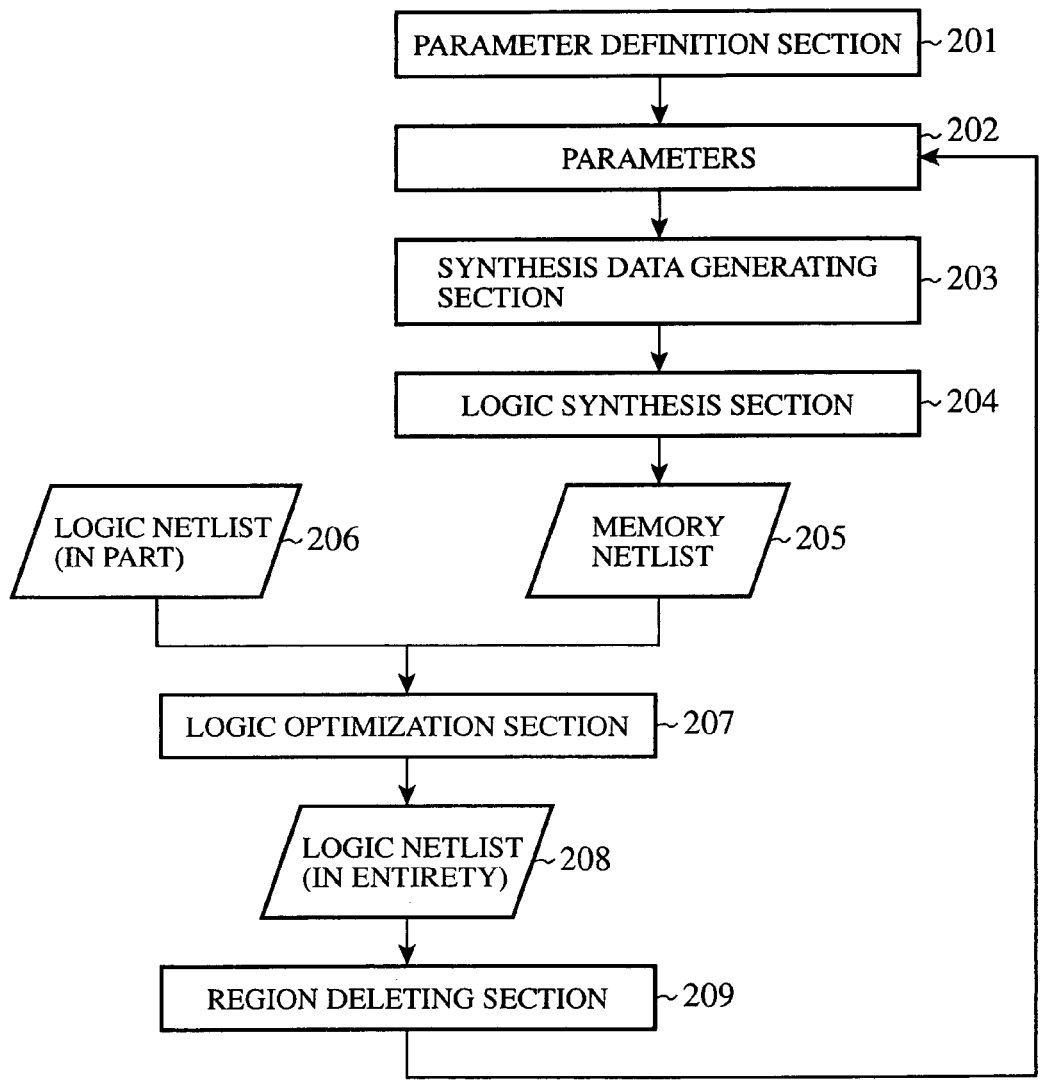
FIG. 37 is a block diagram showing a configuration of a circuit design apparatus of an embodiment 23 in accordance with the present invention.

FIG. 37 is a block diagram showing a configuration of a circuit design apparatus of an embodiment 23 in accordance with the present invention. In FIG. 37, the same reference numerals as those of FIG. 30 designate the same or like sections, and their description is omitted here. A region deleting section 209 conducts system verification of the netlist 208 of the semiconductor integrated circuit generated by the logic optimization section 207 to check a used region by the memory 5, and deletes the unused region by the memory 5.

More specifically, when the logic optimization section 207 generates the netlist 208 of the semiconductor integrated circuit, the region deleting section 209 carries out the logic verification and system verification to check the actually used region by the memory 5, and deletes the unused region by the memory 5.

For example, when the capacity of the memory 5 is 1 MB, and the actually used amount is less than the 1 MB, the capacity of the memory 5 is changed in accordance with the actually used amount.

Although the system verification can be conducted by a system simulation, it can also be conducted with a real machine using an evaluation chip or hardware simulator.

Thus, the present embodiment 23 can delete an unnecessary circuit, thereby offering an advantage of being able to reduce the area and power consumption. As for varying the memory size, although it is difficult when the memory is configured with the hard macro, it is easy when the memory is configured with the logic cells as above.

Embodiment 24

Figure 38:
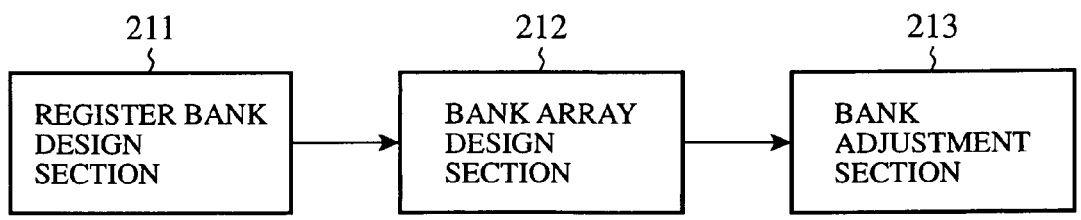
FIG. 38 is a block diagram showing a configuration of a circuit design apparatus of an embodiment 24 in accordance with the present invention.

FIG. 38 is a block diagram showing a configuration of a circuit design apparatus of an embodiment 24 in accordance with the present invention. In FIG. 38, a register bank design section 211 designs a register bank by placing m n-bit registers. A bank array design section 212 designs a register bank array by arraying the register banks designed by the register bank design section 211. A bank adjustment section 213 deletes unnecessary register banks from the register bank array designed by the bank array design section 212, or adds necessary register banks thereto.

Next, the operation of the present embodiment 24 will be described.

First, the register bank design section 211 designs the register bank by placing m n-bit registers.

Subsequently, the bank array design section 212 prepares n×m register banks, the total number of which is a×b, and arrays the a×b register banks to design the register bank array.

Finally, the bank adjustment section 213 deletes unnecessary register banks from the register bank array designed by the bank array design section 212, if there are any.

For example, if the necessary memory capacity is 120 words when the capacity of the register bank array designed by the bank array design section 212 is 128 words (=$2^7$ words), the bank adjustment section 213 deletes eight words which are not used.

On the other hand, if the register bank array designed by the bank array design section 212 requires more register banks, it adds the required number of register banks.

For example, if the necessary memory capacity is 130 words when the capacity of the register bank array designed by the bank array design section 212 is 128 words (=$2^7$ words), the bank adjustment section 213 adds two words required.

The present embodiment 24 configures the array in a stepwise process. Accordingly, it can facilitate the logic optimization processing, thereby offering an advantage of being able to reduce the design period of the semiconductor integrated circuit.

What is claimed is:

1. A semiconductor integrated circuit comprising:
 a logic region where a logic circuit configured with logic cells is placed;
 a hard macro cell region where hard macro cells are placed; and
 a memory for storing data which said logic circuit inputs and outputs,
 wherein said memory is configured with said logic cells, and is placed in said logic region, and
 wherein said memory comprises:
  a control signal generating section for generating a control signal from a read/write signal; and a data holding section for holding data output from said logic circuit when the control signal generated by said control signal generating section instructs data write, and for outputting data held in said data holding section when the control signal instructs data read.

2. The semiconductor integrated circuit according to claim 1, wherein when said memory holds data consisting of a plurality of bits, said control signal generating section generates control signals, a number of the control signals being equal to a number of the bits; and said data holding section includes a plurality of data holding elements, a number of the data holding elements being equal to the number of the bits, and wherein said memory further comprises:

a selecting section for selecting data corresponding to an address signal from output data of said plurality of data holding elements.

3. The semiconductor integrated circuit according to claim 2, wherein said selecting section is configured with multiplexers.

4. The semiconductor integrated circuit according to claim 2, wherein said selecting section is configured with tristate buffers.

5. The semiconductor integrated circuit according to claim 2, wherein said data holding section is configured with hard macro cells.

6. The semiconductor integrated circuit according to claim 2, wherein said data holding section reads data from one of a plurality of ports, and holds the data.

7. The semiconductor integrated circuit according to claim 2, wherein said data holding section outputs data it holds to a plurality of ports.

8. The semiconductor integrated circuit according to claim 1, wherein said memory overlaps with part of said logic circuit.

* * * * *